United States Patent
Lin et al.

(10) Patent No.: US 12,058,868 B2
(45) Date of Patent: Aug. 6, 2024

(54) SEMICONDUCTOR MEMORY DEVICES WITH ARRAYS OF VIAS AND METHODS OF MANUFACTURING THEREOF

(71) Applicant: Taiwan Semiconductor Manufacturing Company, Ltd., Hsinchu (TW)

(72) Inventors: Meng-Han Lin, Hsinchu (TW); Chia-En Huang, Xinfeng (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 253 days.

(21) Appl. No.: 17/458,744

(22) Filed: Aug. 27, 2021

(65) Prior Publication Data
US 2022/0320141 A1 Oct. 6, 2022

Related U.S. Application Data

(60) Provisional application No. 63/168,388, filed on Mar. 31, 2021.

(51) Int. Cl.
*H10B 51/20* (2023.01)
*H10B 51/10* (2023.01)
*H10B 51/30* (2023.01)
*H10B 51/50* (2023.01)

(52) U.S. Cl.
CPC ............. *H10B 51/20* (2023.02); *H10B 51/10* (2023.02); *H10B 51/30* (2023.02); *H10B 51/50* (2023.02)

(58) Field of Classification Search
CPC ........ H10B 43/20; H10B 43/30; H10B 43/40; H10B 43/50; H10B 51/20; H10B 51/30; H10B 51/40; H10B 51/50
See application file for complete search history.

(56) References Cited

U.S. PATENT DOCUMENTS

| | | | |
|---|---|---|---|
| 2017/0133398 A1* | 5/2017 | Son | H10B 43/27 |
| 2017/0133399 A1* | 5/2017 | Kim | H01L 23/535 |
| 2021/0091204 A1* | 3/2021 | Rabkin | H01L 29/41725 |
| 2022/0068857 A1* | 3/2022 | Chen | H10B 41/27 |
| 2022/0139456 A1* | 5/2022 | Lim | H10B 43/27 257/314 |

FOREIGN PATENT DOCUMENTS

| | | | | |
|---|---|---|---|---|
| CN | 109427794 A | * | 3/2019 | H01L 21/4814 |
| KR | 20160069596 A | * | 6/2016 | H10B 43/40 |

* cited by examiner

*Primary Examiner* — Matthew E Warren
(74) *Attorney, Agent, or Firm* — FOLEY & LARDNER LLP

(57) ABSTRACT

A semiconductor die comprises: a device portion comprising an array of semiconductor devices extending in a first direction; and at least one interface portion located adjacent to an axial end of the device portion in the first direction. The at least one interface portion has a staircase profile in a vertical direction. The interface portion comprises: a stack comprising a plurality of gate layers and a plurality of insulating layers alternatively stacked on top of one another, and memory layers interposed between each of the plurality of gate layers and the plurality of insulating layers.

20 Claims, 30 Drawing Sheets

SEMICONDUCTOR MEMORY DEVICES WITH ARRAYS OF VIAS AND METHODS OF MANUFACTURING THEREOF

CROSS-REFERENCE TO RELATED APPLICATIONS

The present application claims priority to and benefit of U.S. Provisional Application No. 63/168,388, filed Mar. 31, 2021, the entire disclosure of which is incorporated herein by reference.

BACKGROUND

The present disclosure generally relates to semiconductor devices, and particularly to methods of making a 3-dimensional (3D) memory device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
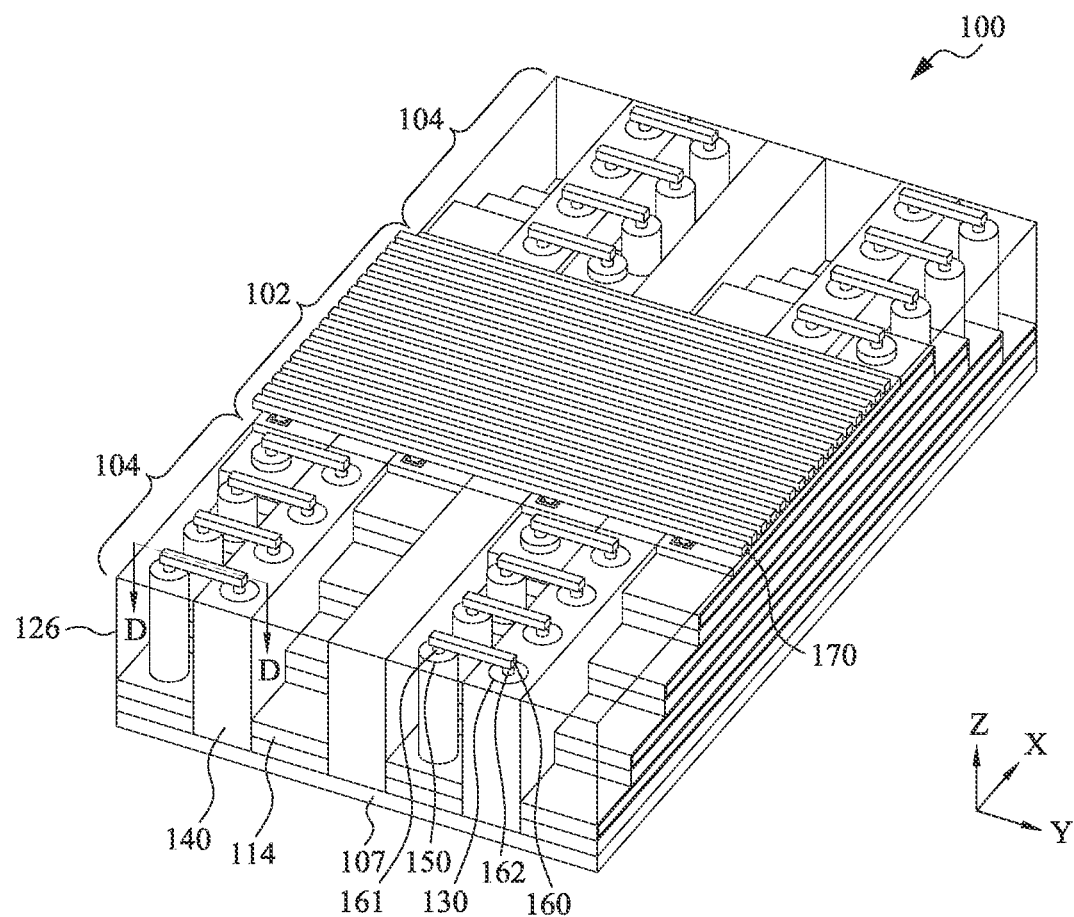
FIG. 1 is a top, perspective view of a semiconductor die including a device portion that includes an array of semiconductor devices, and an interface portion that has a staircase profile in a vertical direction, according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, 3D memories include an array of memory devices formed in a stack of insulating layers and gate layers, and may include a double gate or plurality of gate layers. Such double gate structures can provide a higher etching aspect ratio. During fabrication, the die including an array of memory devices is formed such that an interface portion is formed on either side of the array of memory devices to allow electrical interface with the memory devices included in the array. Such an interface portion may have a staircase profile formed at axial end of a stack of gate layers and insulating layers. Interface vias that are configured to be coupled to external devices, and gate vias that are electrically coupled to the one or more gate layers are generally formed in the interface portions after the memory devices have been formed in a device portion located between the interface portions. To form the gate vias, cavities corresponding to the gate vias are etched in the interface portion up to gate layers that extend into the interface portion, and the cavities are then filled with a conductive material to form the gate vias. However, because of the staircase profile of the interface portion, cavities of different heights have to be formed in the interface portion to access a corresponding gate layer in the stack so as to account for the difference in heights along the staircase profile of interface portion. However, the materials used to the form the insulating layer and the gate layers may not have sufficient etch selectivity with the interlayer dielectric of the interface portion in which the gate vias are formed such that over etching of the vias may occur and at least portions of the gate layers and insulating layers are also etched during the etching process, which is undesirable.

Embodiments of the present disclosure are discussed in the context of forming a semiconductor die, and particularly in the context of forming 3D memory devices, that are formed in a stack of insulating and gate layers. For example, the present disclosure provides semiconductor dies which include a device portion including an array of memory devices and at least one interface portion adjacent to the device portion. The at least one interface portion has a staircase profile formed by a stack of gate layers and insulating layers. The at least one interface portion includes an array of gate layers and insulating layers alternatively stack on top of one another. A memory layer is interposed between each of the plurality of gate layers and the plurality of insulating layers. The memory layers serve as etch stops for the etch used to form cavities through the interlayer dielectric within which the gate vias are formed, and prevent over etching of the insulating layers and gate layers such that each gate via has a height that corresponds to the elevation of a corresponding gate layer of the stack in the vertical direction.

Figure 2:
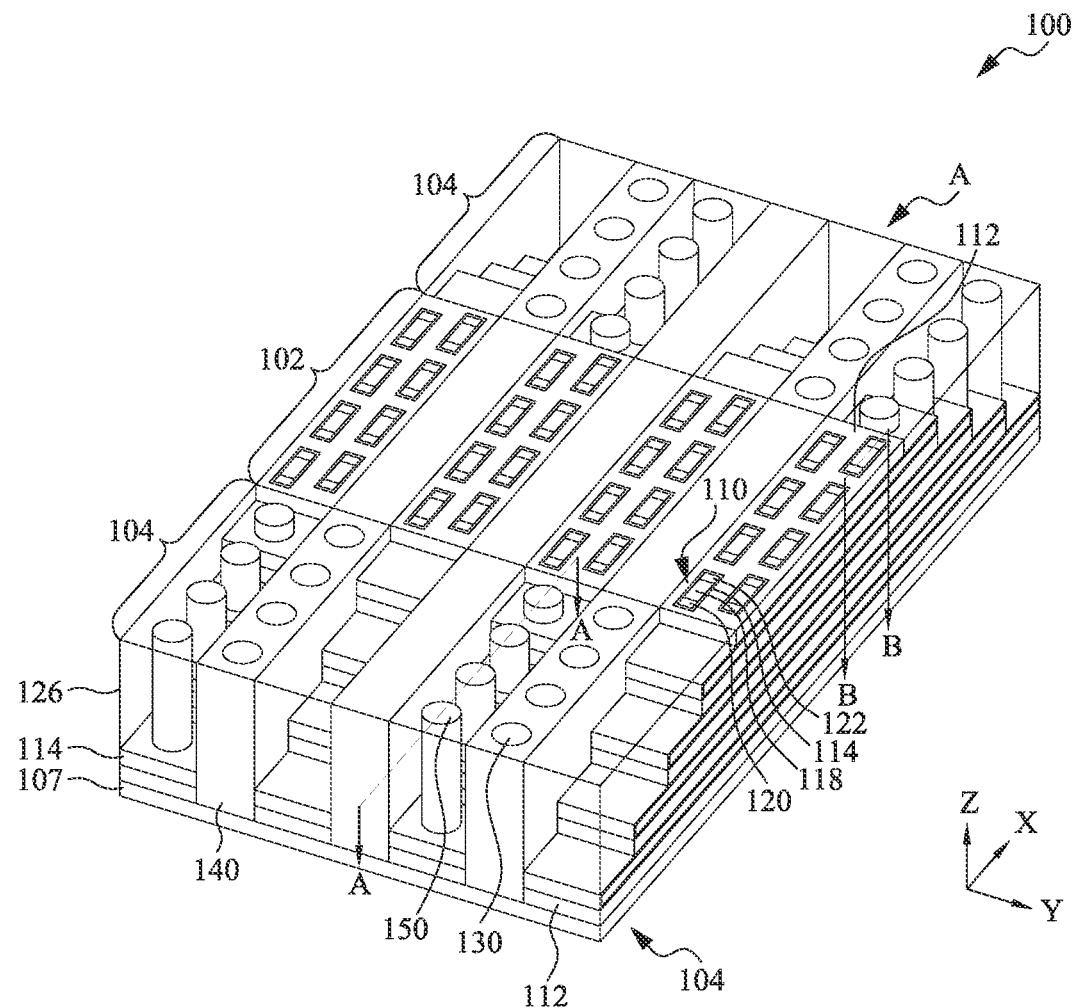
FIG. 2 is a top, perspective view of the semiconductor die of FIG. 1 with through via caps coupled to the gate vias and interface vias included in the interface portion being removed, and driver lines coupled to the semiconductor devices also being removed to show the underlying structure.

FIG. 1 is a top, perspective view of a semiconductor die 100, according to an embodiment. FIG. 2 is a top, perspective view of the semiconductor die of FIG. 1 with through via caps 160 coupled to the gate vias and interface vias included in interface portions 104 of the semiconductor die 100 being removed, and driver lines 170 coupled to semiconductor devices 100 also being removed to show the underlying structure. The semiconductor die 100 includes a device portion 102 including an array of semiconductor devices 110 (e.g., memory devices), and a set of interface portions 104 located adjacent to axial ends of the device portion 102 in a first direction, for example, the X-direction. The device portion 102 and the interface portions 104 may be disposed on a substrate 107 that may be a wafer, such as a silicon wafer. Generally, an SOI substrate includes a layer of a semiconductor material formed on an insulator layer. The insulator layer may be, for example, a buried oxide (BOX) layer, a SiO layer, a SiN layer, or the like. The insulator layer is provided on a substrate, typically a silicon or glass substrate. Other substrates, such as a multi-layered or gradient substrate may also be used. In some embodiments, the semiconductor material of the substrate 107 may include silicon; germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable semiconductor material, or combinations thereof. Each row of the array of the semiconductor devices 110 extends in the first direction, for example, the X-direction. The interface portions 104 have a staircase profile in a vertical direction (e.g., the Z-direction).

Figure 3:
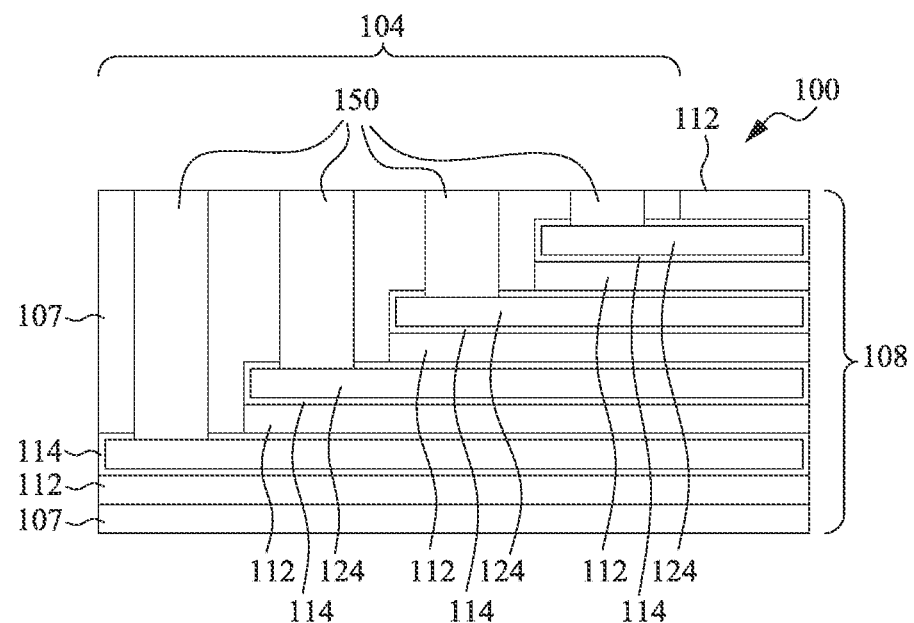
FIG. 3 is a side cross-section view of a portion of the interface portion of the semiconductor die of FIG. 2 taken along the line A-A in FIG. 2.

Referring also to FIG. 3, which is a side cross-section view of a portion of the interface portion 104 of the semiconductor die of FIG. 2 taken along the line A-A in FIG. 2, the interface portions 104 includes a stack 108 comprising a plurality of gate layers 124 and a plurality of insulating layers 112 stacked on top of one another in the vertical direction (e.g., the Z-direction). In some embodiments, a topmost layer and a bottommost layer of the stack 108 may include an insulating layer 112 of the plurality of insulating layers 112. The bottommost insulating layer 112 may be disposed on the substrate 107. The insulating layer 112 may be formed from an electrically insulating material (e.g., silicon oxide ($SiO_2$), silicon nitride (SiN), silicon oxide (SiO), silicon carbide nitride (SiCN), silicon oxycarbonitride (SiOCN), silicon oxynitride (SiON), HfO2, $TaO_X$, $TiO_X$, $AlO_X$, etc.). Moreover, the gate layer 124 may be formed from a conductive material such as a metal, for example, aluminum (Al), titanium (Ti), tungsten (W), copper (Cu), cobalt (Co), TiN, tantalum nitride (TaN), silver (Ag), gold (Au), nickel (Ni), chromium (Cr), hafnium (Hf), ruthenium (Ru), platinum (Pt), tungsten nitride (WN), etc., or a high-k dielectric material, for example, hafnium oxide (HfO), tantalum oxide ($TaO_x$), $TiO_x$ etc.

Each of the plurality of gate layers 124 extend from the device portion 102 to the interface portions 104 along the respective row of semiconductor devices 110, each of the plurality of gate layers 124 being continuous from the device portion 102 to the interface portions 104. Moreover, the insulating layers 112 may also extend from device portion 102 to the interface portions 104. The insulating layers 112 and the gate layers 124 have a length such that a bottommost first pair of an insulating layer 112 and a gate layer 124 has a longer length than a subsequent second pair of an insulating layer 112 and a gate layer 124 disposed immediately above the bottommost pair in the Z-direction. Similarly, a subsequent third pair of an insulating layer 112 and a gate layer 124 disposed above the second pair in the Z-direction has a shorter length than the second pair such that each subsequent pair has a shorter length than an immediately preceding pair disposed below it.

The topmost layer in the stack 108 may be an insulating layer 112 that has a shorter length than the gate layer/s 124 disposed immediately below it, and the interface portions 104 are formed by the portion of the subsequent layers disposed below the topmost insulating layer 112. The step wise increase in length of the subsequent pairs of the insulating layer 112 and the gate layer 124 from the topmost insulating layer 112 to the bottommost insulating layer 112 causes the interface portions 104 to have a staircase or step profile in the vertical or Z-direction with a portion of the gate layer 124 (and thereby a memory layer 114 disposed thereon, as described herein) in each pair forming a top exposed layer of each step in the interface portions 104. The interface portions 104 provide an electrical connection interface allowing a controller or driver to be electrically coupled to the gate layer 124.

Additionally, the interface portions 104 include memory layers 114 interposed between each of the plurality of gate layers 124 and the plurality of insulating layers 112. In some embodiments, the memory layers 114 may include a ferroelectric material, for example, lead zirconate titanate (PZT), $PbZr/TiO_3$, $BaTiO_3$, $PbTiO_2$, $HfO_2$, $Hr1-xZ_{rx}O_2$, $ZrO_2$, $TiO_2$, NiO, $TaO_x$, $Cu_2O$, $Nb_2O_5$, $AlO_x$, etc. The memory layers 114 extend in the first direction (e.g., the X-direction) from the device portion 102 to the interface portions 104 such that each semiconductor device 110 located in a row of the array of semiconductor devices 110 includes a portion of the memory layer 114, and the memory layer 114 is connected to each of the semiconductor devices 110 included in a corresponding row, as described in further detail herein.

The memory layer 114 is disposed on at least a top surface and a bottom surface of each of the plurality of gate layers 124 in the vertical direction, and may also be disposed on a side surface of each of the plurality of gate layers (e.g., an axial end surface in the first direction) or a portion of a side surface of each of the gate layers 124 in a second direction perpendicular to the first direction (e.g., the Y-direction) between a channel layer 116 included in each of the semiconductor devices 110 and the portion of the gate layer 124 adjacent to a corresponding semiconductor device 110. Thus, a portion of the memory layers 114 disposed on the top surface of the gate layers 124 forms the top exposed layer of each step in the interface portions 104. In some embodiments, a single memory layer 114 maybe interposed between each gate layer 124 and a corresponding insulating layer 112. In other embodiments, each memory layer 114 may include a plurality of sublayers (e.g., 2, 3, or even more sublayers). Each of the sublayers of such multilayer memory layers 114 may be formed from the same material or different materials.

The interface portions 104 include an array of gate vias 150, each of which is coupled to a corresponding gate layer 124 of the plurality of gate layers 124. For example, as shown in FIG. 3, an interlayer dielectric (ILD) 126 is disposed on the stack 108 on the interface portions 104, and the array of gate vias 150 are formed through the ILD 126. The dielectric material of the ILD 126 may include SiO, phosphosilicate glass (PSG), borosilicate glass (BSG), boron-doped phosphosilicate Glass (BPSG), undoped silicate glass (USG), or combinations thereof. The gate vias 150 may be formed by etching cavities through the ILD 126 up to the memory layer 114. Memory layers 114 included in the stack serve as etch stops such that the cavities corresponding to the gate vias 150 stop at the memory layer 114. In this manner, the memory layers 114 prevent over etching by the etch used to form the cavities in the ILD 126 so as to prevent etching of the gate layers 124 and the insulating layers 112. A selective etch is then used to etch portion of the memory layer 114 located at the base of the cavities to expose a top surface of the corresponding gate layers 124. Agate via material, for example, a conducting material such as tungsten (W), copper (Cu), cobalt (Co), or any other suitable material is then deposited in the cavities formed in the ILD 126 to form the gate vias 150 that are electrically coupled to a top surface of the corresponding gate layer 124.

The interface portions 104 also include an array of interface vias 130 disposed adjacent to corresponding gate vias 150 the array of gate vias 150 in the second direction (e.g., the Y-direction) that is electrically coupled to a corresponding gate via 150 of the array of gate vias 150. For example, as shown in FIGS. 1 and 2, the interface portions 104 and the device portion 102 may include a plurality of stacks 108 disposed parallel to each other in the second direction (e.g., the Y-direction), each stack corresponding to a set of semiconductor devices 110 in the array of semiconductor devices 110. The semiconductor die 100 further comprises an insulation structure 140 interposed between adjacent stacks 108 of the plurality of stacks 108, as shown in FIGS. 1-2. The insulation structures 140 extend from a top surface of the semiconductor die 100 to the substrate 107. The array of interface vias 130 are defined through the insulation structures 140 to the substrate 107. The interface vias 130 may extend through the substrate 107, and are configured to be coupled to an external device 10. The external device 10 may include, for example, a printed circuit board or circuit having an external device via 12 to which a corresponding interface via 130 is coupled (e.g., soldered, fusion bonded, welded, etc.). The external device 10 may include a circuit 14 (e.g., a transistor, switch, etc.) configured to selectively communicate an electrical signal to a corresponding interface via 130 by the external device via 12.

Figure 5:
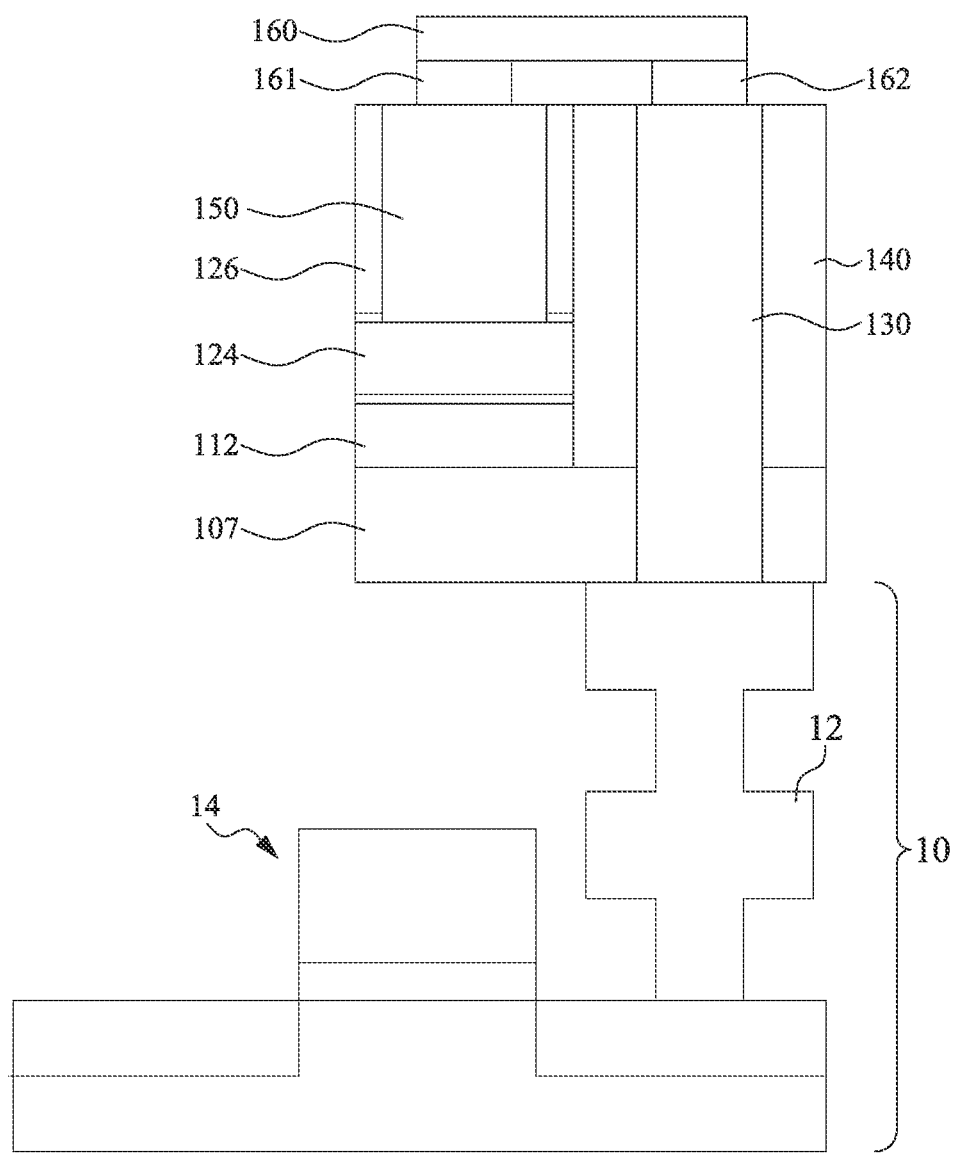
FIG. 5 is a side cross-section view of a portion of the interface portion of the semiconductor die of FIG. 1 take along the line D-D in FIG. 1.

Referring also now to FIG. 5, which shows a side cross-section view of the semiconductor die 100 taken along the line D-D in FIG. 1, each gate via 150 is electrically coupled to at least one interface via 130 located adjacent thereto. In some embodiments, the interface vias 130 and the gate vias 150 are formed from the same material (e.g., a conducting material such as tungsten (W), copper (Cu), cobalt (Co), or any other suitable material). In some embodiments, the gate vias 150 and the interface vias 130 may be formed simultaneously using the same fabrication steps. Each gate via 150 is electrically coupled to a corresponding gate layer 124, as shown in FIG. 5. Moreover, at least one gate through via 161 is coupled to each gate via 150 of the array of gate vias 150. At least one interface through via 162 is coupled to each interface via 130 of the array of the interface vias 130. A through via cap 160 is coupled to the at least one gate through via 161 of a gate via 150, and the at least one interface through via 162 of a corresponding interface via 130 located adjacent to the respective gate via 150.

For example, as shown in FIGS. 1-2 and 5, a gate through via 161 is coupled to a corresponding gate via 150 and projects upwards from the gate via 150 in the vertical direction (e.g., the Z-direction) away from the gate via 150. A gate through via 161 is coupled to the gate via 150 and an interface through via 162 is coupled to the interface via 130 disposed adjacent to the gate via 150, the gate through via 161 and the interface through via 162 projecting upwards from the gate via 150 and the interface via 130 in the vertical direction (e.g., the Z-direction), respectively. The through via cap 160 is coupled to the gate through via 161 and the interface through via 162. In this manner, the through via cap 160 electrically shorts the interface via 130 to a corresponding gate via 150 such that the electrical signal communicated to the interface vias 130 from the external device 10 via the external device via 12 is communicated to the gate via 150 via the through via cap 160. The gate via 150 communicates the electrical signal to a corresponding gate layer 124 so as to selectively activate a corresponding row of semiconductor devices 110. The gate through via 161 and the interface through vias 162 may be formed from a conducting material for example, tungsten (W), copper (Cu), cobalt (Co), etc.

Figure 4A:
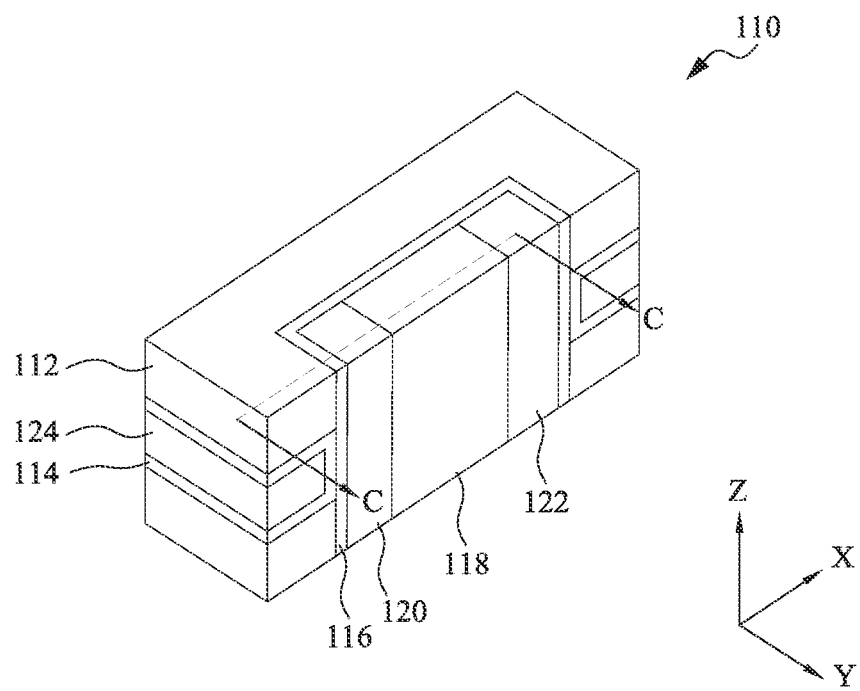
FIG. 4A is a side cross-section view of a semiconductor device included in the semiconductor die of FIG. 2 taken along the line B-B in FIG. 2, according to an embodiment.
Figure 4B:
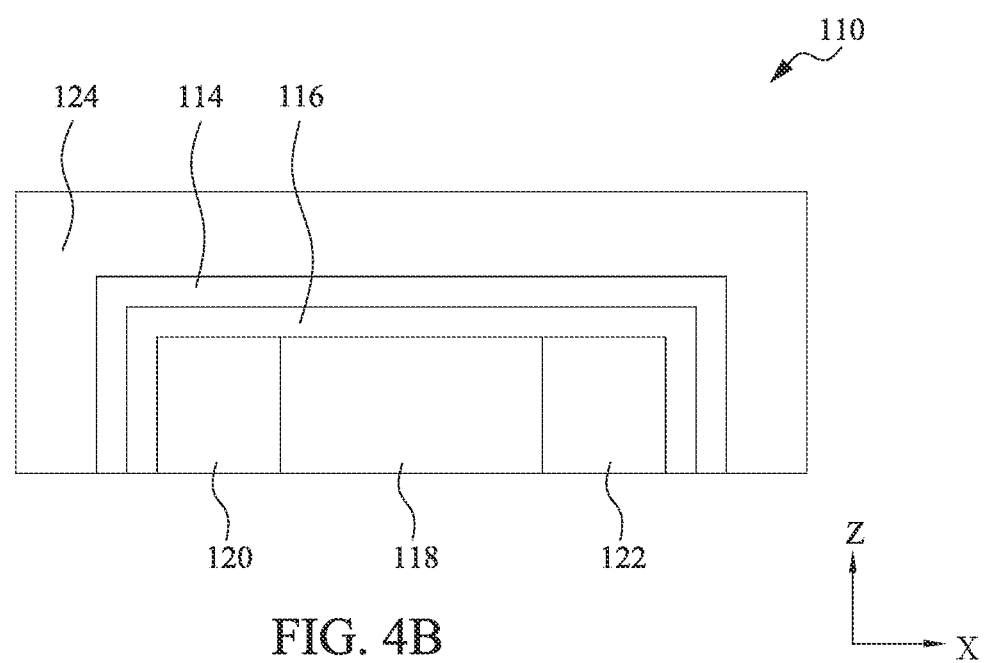
FIG. 4B is a top cross-section view the semiconductor die of FIG. 4A taken along the line C-C in FIG. 4A.

FIG. 4A is a side cross-section view of a semiconductor device included in the semiconductor die of FIG. 2 taken along the line B-B in FIG. 2, and FIG. 4B is a top cross-section view the semiconductor die of FIG. 4A taken along the line C-C in FIG. 4A, according to an embodiment. As shown in FIGS. 4A-4B, each semiconductor device 110 includes a source 120 and a drain 122 spaced apart from the source 120 in the first direction (e.g., the X-direction). An inner spacer 118 is disposed between the source 120 and the drain 122. In some embodiments, the source 120 and/or the drain 122 may include a conducting material, for example, metals such as Al, Ti, TiN, TaN, Co, Ag, Au, Cu, Ni, Cr, Hf, Ru, W, Pt, WN, Ru, any other suitable material or a combination or alloy thereof. In some embodiments, the source 120 and/or the drain 122 may include a semiconductor material, for example, an n or p-doped semiconductor such as Si, SiGe, or any other semiconductor material (e.g., IGZO, ITO, IWO, poly silicon, amorphous Si, etc.), and may be formed using a deposition process, an epitaxial growth process, or any other suitable process. The source 120 and the drain 122 extend from a top surface of the semiconductor die 100 to the substrate 107 in a vertical direction (e.g., the Z-direction).

The inner spacer 118 extends between the source 120 and the drain 122. The inner spacer 118 may be formed from an electrically insulating material, for example, silicon nitride (SiN), silicon oxide (SiO), $SiO_2$, silicon carbide nitride (SiCN), silica oxycarbonitride (SiOCN), silicon oxynitride (SiON), $HfO_2$, $TaO_x$, $TiO_x$, $AlO_x$, etc. The inner spacer 118 extends from a top surface of the semiconductor die 100 to the substrate 107 in a vertical direction (e.g., the Z-direction)

A channel layer 116 is disposed on outer surfaces of the source 120, the drain 122 and the inner spacer 118, such that the channel layer 116 wraps around portions of the source 120, the drain 122, and the inner spacer 118. The channel layer 116 extends from a top surface of the semiconductor die 100 to the substrate 107 in the vertical direction (e.g., the Z-direction). In some embodiments, the channel layer 116 may be formed from a semiconductor material, for example, Si (e.g., polysilicon or amorphous silicon), Ge, Side, silicon carbide (SiC), IGZO, ITO, ZnO, IWO, etc. and can be an n-type or p-type doped semiconductor.

Each semiconductor device 110 also includes a plurality of memory layers 114, a portion of each of the plurality of memory layers 114 being in contact with a portion of outer surfaces of the channel layer 116. The memory layer 114 may include a ferroelectric material, for example, lead zirconate titanate (PZT), $PbZr/TiO_3$, $BaTiO_3$, $PbTiO_2$, $HfO_2$, $Hf_{1-x}Zr_xO_2$, $ZrO_2$, $TiO_2$, NiO, $TaO_x$, $Cu_2O$, $Nb_2O_5$, $AlO_x$, or any other suitable material. The memory layer 114 extends from the device portion 102 to each of the interface portions 104 along the respective row of semiconductor devices 110 (i.e., in the first direction) such that the memory layer 114 is continuous from the device portion 102 to the interface portions 104, as shown in FIGS. 1-2.

As previously described herein, each of the array of semiconductor devices 110 (e.g., memory devices) include the stack 108 disposed on outer surface of the channel layer 116, the stack 108 including a plurality of gate layers 124 and plurality of insulating layers 112, and having a portion of a memory layer of the plurality of memory layers 114 interposed between each of the plurality of gate layers 124 and the plurality of insulating layers 112. Moreover, as shown in FIGS. 4A and 4B, a portion of the each of the plurality of memory layers 114 is interposed between a gate layer 124 of each of the plurality of gate layers 124 and the channel layer 116 of a corresponding semiconductor device 110. In some embodiments, an adhesive layer (not shown) may be interposed between the gate layer/s 124 and the memory layer 114, so as to facilitate adhesion of the gate layer 124 to the memory layer 114. In some embodiments, the adhesion layer may include e.g., titanium (Ti), chromium (Cr), or any other suitable adhesive material. Activating the gate layer 124 by applying a voltage to it may cause current to flow from the source 120 to the drain 122 of a corresponding semiconductor device 110 (e.g., a memory device). Moreover, driver lines 170 may be coupled to the source 120 and the drain 122 of the semiconductor devices 110, and may provide electric charge to the source 120 and the drain 122. In some embodiments, a single driver line 170 may be coupled to a set of sources 120 or a set of drains 122 of a plurality of semiconductor devices 110, which are located parallel to each other in the second direction (e.g., the Y-direction).

Figure 6:
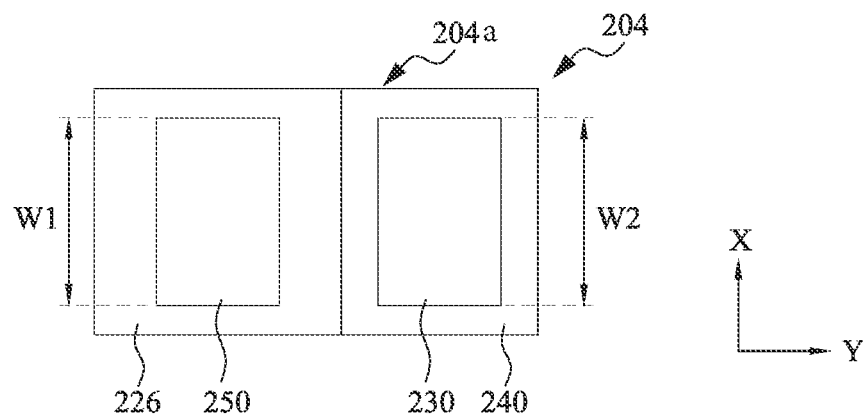
FIGS. 6-10 are top views of gate vias and interface vias having various shapes that can be included in the interface portions of semiconductor dies, according to various embodiments.

While FIG. 2 shows the gate vias 150 and the interface vias 130 having a circular cross-sectional shape, in other embodiments, the gate vias 150 or the interface vias 130 may have any suitable cross-sectional shape. For example, FIG. 6 is a top view of a portion 204a of an interface portion 204 of a semiconductor device, according to an embodiment. The interface portion 204 includes an array of gate vias 250 formed though an ILD 226 up to a corresponding gate layer disposed therebeneath, and an array of interface vias 230 defined in an insulation structure 240 that extends into the interface portion 204, a single gate via 250 and interface via 230 being shown in FIG. 6 for clarity. Each of the gate via 250 and the interface via 230 have a polygonal cross-sectional shape, for example, a rectangular shape as shown in FIG. 6. In other embodiments, the gate vias 250 and the interface vias 230 may have a square, pentagonal, hexagonal, octagonal, or any other suitable polygonal shape. The gate via 250 has a first width W1 in the first direction (e.g., the X-direction) and the interface via 230 has a second width W2 in the first direction. The first width W1 and the second width W2 may be the same or different from each other. In various embodiments, a ratio between W1 and W2 (W1:W2) may be in a range of 1.5 to 0.5 (e.g., 1.5, 1.4, 1.3, 1.2, 1.1, 1, 0.9, 0.8, 0.7, 0.6, or 0.5 inclusive). Other ranges and values are contemplated and are within the scope of this disclosure.

Figure 7:
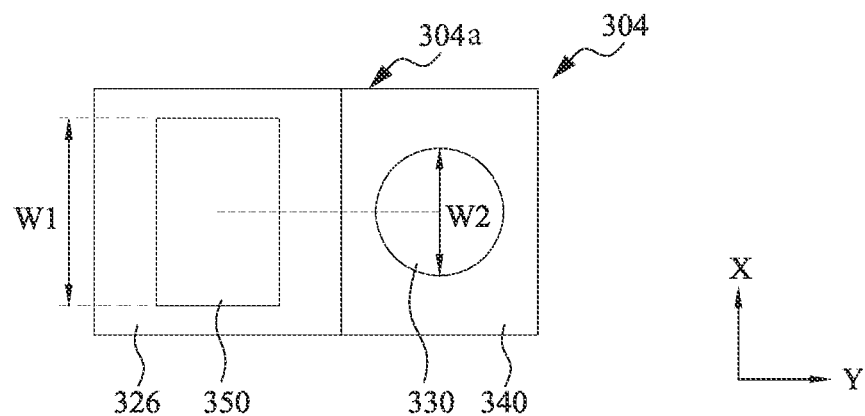

FIG. 7 is a top view of a portion 304a of an interface portion 304 of a semiconductor device, according to an embodiment. The interface portion 304 includes an array of gate vias 350 formed though an ILD 326 up to a corresponding gate layer disposed therebeneath, and an array of interface vias 330 defined in an insulation structure 340 that extends into the interface portion 304, a single gate via 350 and interface via 330 being shown in FIG. 7 for clarity. The gate vias 350 have a polygonal cross-sectional shape (e.g., a rectangular shape as shown in FIG. 7), each of the interface vias 330 have a closed non-polygonal two-dimensional cross-sectional shape having a major axis and a minor axis, for example, a circular shape as shown in FIG. 7. In other embodiments, the interface vias 330 have an oval, elliptical, or asymmetric shape. The gate via 350 has a first width W1 in the first direction (e.g., the X-direction) and the interface via 330 has a cross-sectional second width W2 (e.g., a diameter). The first width W1 is larger than the second cross-sectional width W2. In various embodiments, a ratio between W1 and W2 (W1:W2) may be in a range of 1.2 to 2.0 (e.g., 1.2, 1.4, 1.6, 1.8, or 2.0, inclusive). Other ranges and values are contemplated and are within the scope of this disclosure.

Figure 8:
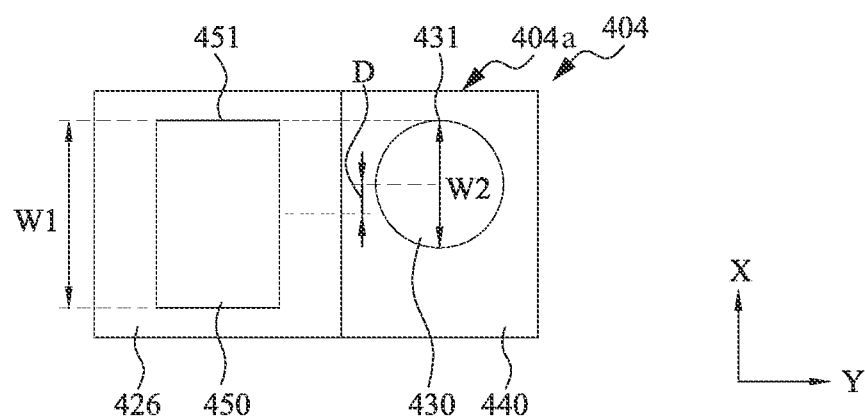

As shown in FIG. 7, a center point of the gate via 350 is axially aligned with a center point of the corresponding interface via 330 in the X-direction. In other embodiments, an interface via may be axially offset from the gate via. For example, FIG. 8 is a top view of a portion 404a of an interface portion 404 of a semiconductor device, according to an embodiment. The interface portion 404 includes an array of gate vias 450 formed though an ILD 426 up to a corresponding gate layer disposed therebeneath, and an array of interface vias 430 defined in an insulation structure 440 that extends into the interface portion 404, a single gate via 450 and interface via 430 being shown in FIG. 8 for clarity. The gate vias 450 have a rectangular cross-sectional shape having a first width W1, and the interface via 430 has a circular shape having a second cross-sectional width W2, similar to the gate vias 350 and interface vias 330 of the interface portion 304 of FIG. 7. However, different from the interface portion 304, the interface via 430 of FIG. 8 is axially offset from the adjacent gate via 450 in the first direction (e.g., the X-direction) by a distance D. In some embodiments, the distance D may be in a range of 0.1 W2 to 0.5 W2, inclusive, but other ranges and values are contemplated and are within the scope of this disclosure. In some embodiments, the distance D is selected such that a peripheral edge 431 of the interface via 430 is axially aligned in the X-direction with a corresponding axial edge 451 of the gate via 450 located adjacent thereto.

Figure 9:
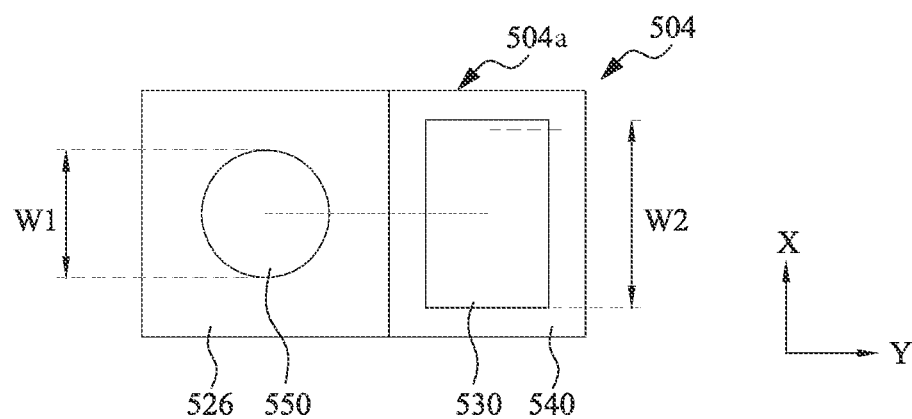

FIG. 9 is a top view of a portion 504a of an interface portion 504 of a semiconductor device, according to an embodiment. The interface portion 504 includes an array of gate vias 550 formed though an ILD 526 up to a corresponding gate layer disposed therebeneath, and an array of interface vias 530 defined in an insulation structure 540 that extends into the interface portion 504, a single gate via 550 and interface via 530 being shown in FIG. 9 for clarity. The interface vias 530 have a polygonal cross-sectional shape (e.g., a rectangular shape as shown in FIG. 9), and each of the gate vias 550 have a closed non-polygonal two-dimensional cross-sectional shape, for example, a circular shape as shown in FIG. 9. In other embodiments, the gate via 550 may have an oval, elliptical, or asymmetric shape. The gate via 550 has a first cross-sectional width W1 (e.g., a diameter) in the first direction (e.g., the X-direction) and the interface via 530 has a second width W2 in the second direction, the second width W2 being larger than the first cross-sectional width W1. In various embodiments, a ratio between W1 and W2 (W1:W2) may be in a range of 0.5 to 0.8 (e.g., 0.5, 0.6, 0.7, or 0.8, inclusive). Other ranges and values are contemplated and are within the scope of this disclosure. As shown in FIG. 9, a center point of the gate via 550 is axially aligned with a center point of the corresponding interface via 530 in the X-direction.

Figure 10:
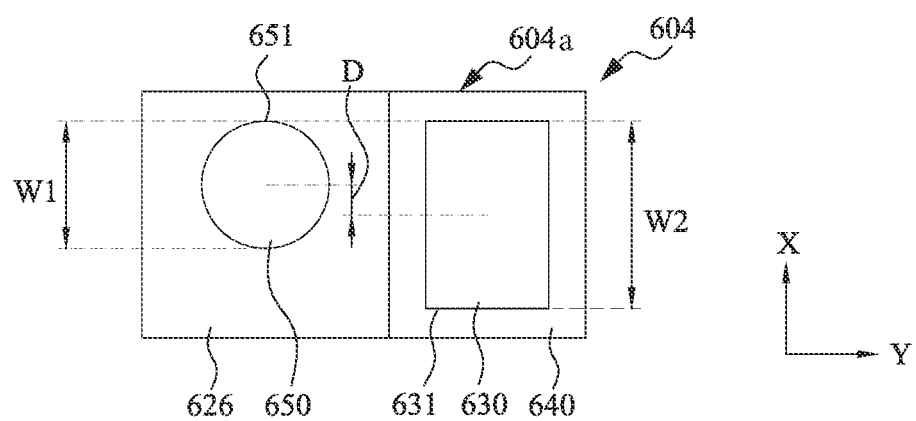

FIG. 10 is a top view of a portion 604a of an interface portion 604 of a semiconductor device, according to an embodiment. The interface portion 604 includes an array of gate vias 650 formed though an ILD 626 up to a corresponding gate layer disposed therebeneath, and an array of interface vias 630 defined in an insulation structure 640 that extends into the interface portion 604, a single gate via 650 and interface via 630 being shown in FIG. 10 for clarity. The gate vias 650 have a circular cross-sectional shape having a first cross-sectional width W1, and the interface via 630 has rectangular shape having a second width W2 in the first direction (e.g., the X-direction), similar to the gate vias 550 and interface vias 530 of the interface portion 504 of FIG. 9. However, different from the interface portion 504, the gate via 650 of FIG. 10 is axially offset from the adjacent interface via 630 in the first direction (e.g., the X-direction) by a distance D. In some embodiments, the distance D may be in a range of 0.1 W1 to 0.5 W1, inclusive. Other ranges and values are contemplated and are within the scope of this disclosure. In some embodiments, the distance D is selected such that a peripheral edge 651 of the gate via 650 is axially aligned in the X-direction with a corresponding axial edge 631 of the interface via 630 located adjacent thereto.

Figure 11A:
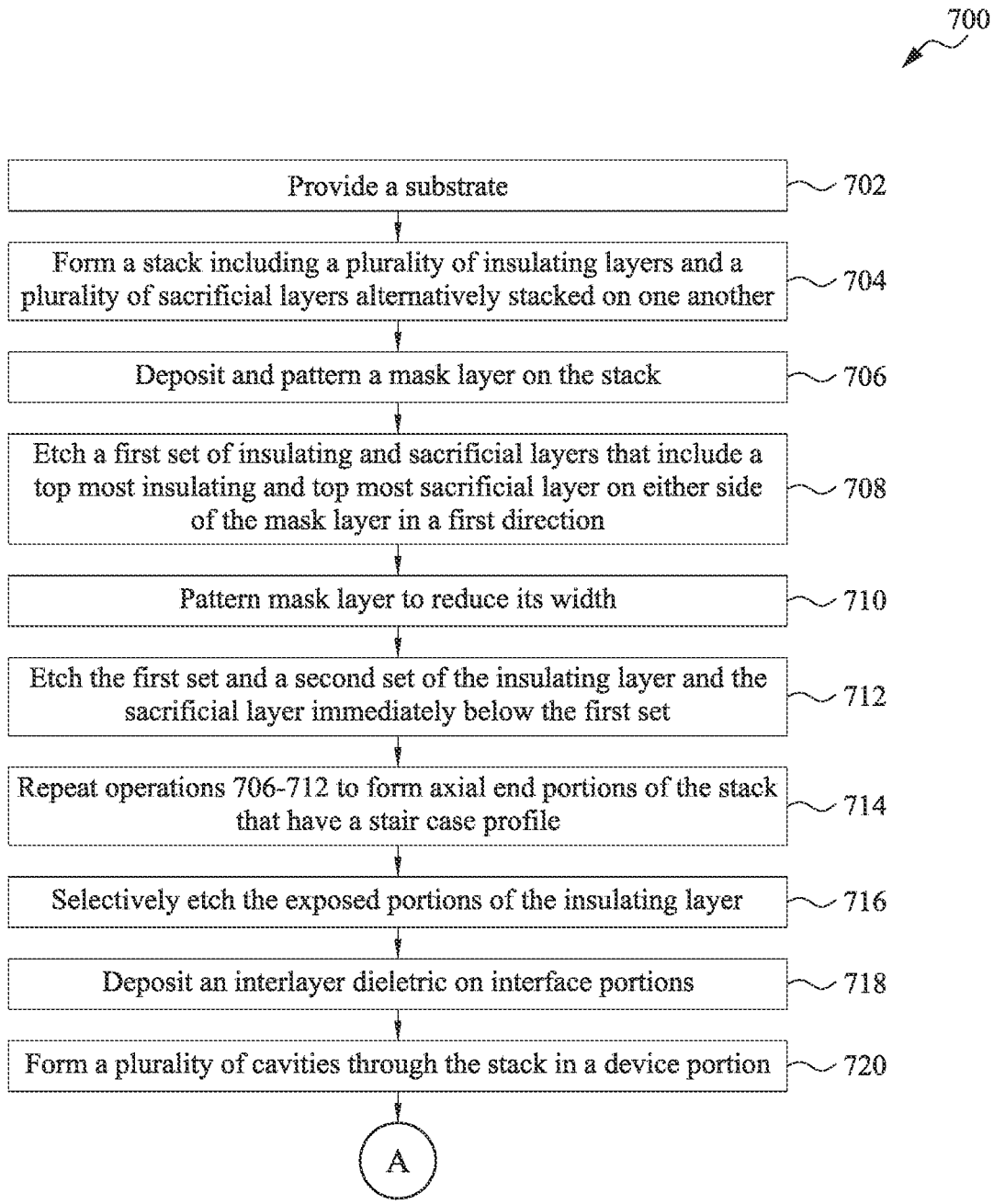
FIGS. 11A-11C are schematic flow charts of a method for forming a semiconductor die, according to an embodiment.
Figure 11B:
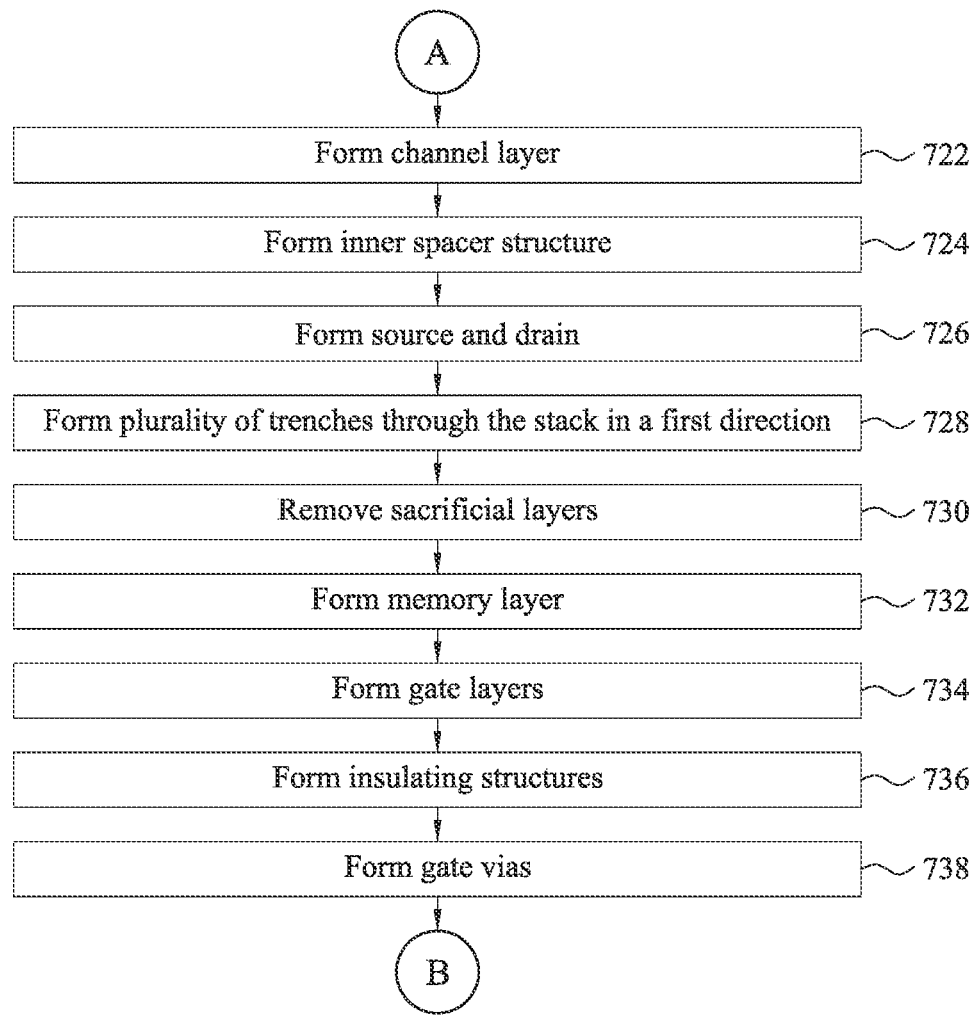
Figure 11C:
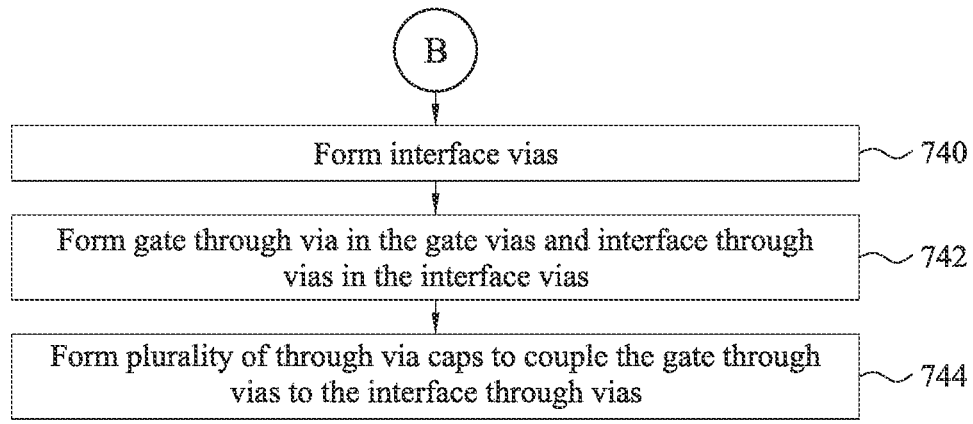

FIGS. 11A-11C illustrate a flowchart of a method 700 for forming a semiconductor die 800, for example, a die including a plurality of 3D memory devices (e.g., any of the semiconductor dies described with respect to FIGS. 1-10), according to an embodiment. For example, at least some of the operations (or steps) of the method 700 may be used to form a 3D memory device (e.g., the semiconductor device 110), a nanosheet transistor device, a nanowire transistor device, a vertical transistor device, or the like. It should be noted that the method 700 is merely an example, and is not intended to limit the present disclosure. Accordingly, it is understood that additional operations may be provided before, during, and after the method 700 of FIGS. 11A-11C, and that some other operations may only be described briefly described herein. In some embodiments, operations of the method 700 may be associated with perspective views of the example semiconductor die 800 at various fabrication stages as shown in FIGS. 12, 13, 14, 15, 16, 17, 18, 19, 20, 21A, 21B, 22A, 22B, 23A, 23B, 24, 25A, 25B, 26A, 26B, 26C, 27, 28A, 28B, 28C, 28D, 29, and 30, and in some embodiments are represented with respect to the semiconductor die 800 that represents a 3D memory device, the operations are equally applicable to any other semiconductor device, for example, the semiconductors shown in FIGS. 6-10 or any other semiconductor die (e.g., a GAA FET device, a nanosheet transistor device, a nanowire transistor device, a vertical transistor device, etc.). Although FIGS. 12-30 illustrate the semiconductor die 800 including the plurality of semiconductor devices 110 and the interface portions 104, it is understood the semiconductor die 800 may include a number of other devices such as inductors, fuses, capacitors, coils, etc., which are not shown in FIGS. 12-30, for purposes of clarity of illustration.

The method 700 may generally include providing a stack comprising a plurality of insulating layers and a plurality of sacrificial layers alternatively stacked on top of each other. One of the insulating layers may form a bottom layer, and another of the insulating layers may form a top layer of the stack. The method 700 may also include forming interface portion on axial ends of the stack in a first direction (e.g., the X-direction) such that the stack forms a device portion interposed between the interface portions, the interface portions having a staircase profile in a vertical direction (e.g., the Z-direction). The method 700 includes forming an array of cavities in the device portion. Channel layers are formed on walls of each of the array of cavities. A source and a drain are formed in each of the array of cavities. The method 700 also includes removing the plurality of sacrificial layers, and forming a plurality of memory layers extending from the device portion to the interface portions on walls of the insulating layers that face another insulating layer. The method 700 also includes forming a plurality of gate layers between adjacent insulating layers in the vertical direction such that a memory layer of the plurality of memory layers is interposed between each of the plurality of gate layers and the plurality of insulating layers.

In some embodiments, the method 700 also includes forming an ILD at the interface portions. A plurality of ILD cavities are formed through the ILD to each of the plurality of memory layers included in the stack such that the memory layer serves as an etch stop. Gate vias are formed in each of the interlayer dielectric cavities, each of the gate vias being coupled to a corresponding gate layer of the plurality of gate layers through a memory layer of the plurality of memory layers disposed on the plurality of gate layers. In some embodiments, the method also includes forming a plurality of interface vias adjacent to corresponding gate vias in a second direction perpendicular to the first direction, and each interface via of the plurality of interface vias being coupled to a corresponding gate via of the plurality of gate vias.

Figure 12:
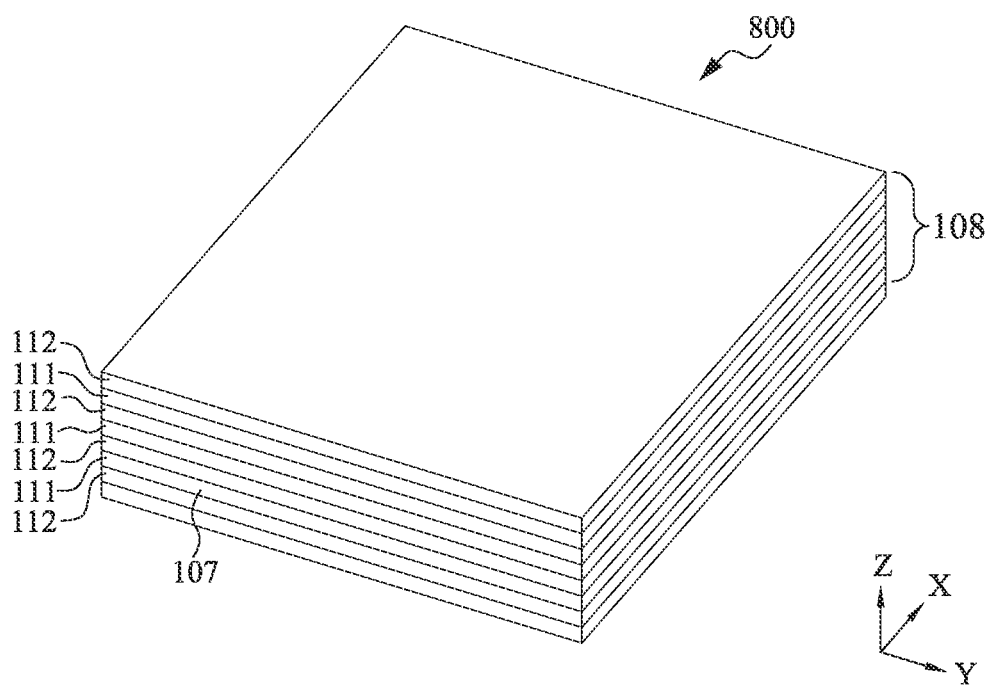
FIGS. 12, 13, 14, 15, 16, 17, 18, 19, 20, 21A, 21B, 22A, 22B, 23A, 23B, 24, 25A, 25B, 26A, 26B, 26C, 27, 28A, 28B, 28C, 28D, 29, and 30 illustrate various views of an example semiconductor die (or a portion of the example semiconductor die) during various fabrication stages, made by the method of FIGS. 11A-11C, in accordance with some embodiments.

Expanding further, the method 700 starts with operation 702 that includes providing a substrate, for example, the substrate 107 shown in FIG. 12. The substrate 107 may be a semiconductor substrate, such as a bulk semiconductor, a semiconductor-on-insulator (SOI) substrate, or the like, which may be doped (e.g., with a p-type or an n-type dopant) or undoped. The substrate 107 may be a wafer, such as a silicon wafer. Generally, an SOI substrate includes a layer of a semiconductor material formed on an insulator layer. The insulator layer may be, for example, a buried oxide (BOX) layer, a SiO layer, a SiN layer, or the like. The insulator layer is provided on a substrate, typically a silicon or glass substrate. Other substrates, such as a multi-layered or gradient substrate may also be used. In some embodiments, the semiconductor material of the substrate 107 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable semiconductor material, or combinations thereof.

At 704, a stack (e.g., the stack 108 shown in FIG. 12) is formed on the substrate 107. The stack includes a plurality of insulating layers (e.g., the insulating layers 112) and a plurality of sacrificial layers (e.g., the sacrificial layers 111 shown in FIG. 12) alternately stacked on top of each other in the vertical direction (e.g., the Z-direction). Corresponding to operations 702-704, FIG. 12 is a top, perspective view of the stack 108 disposed on the substrate 107. The insulating layers 112 and the sacrificial layers 111 are alternately disposed on top of one another in the Z-direction. For example, one of the sacrificial layers 111 is disposed over one of the insulating layers 112, then another one of the insulating layers 112 is disposed on the sacrificial layer 111, so on and so forth. As shown in FIG. 12, a topmost layer (e.g., a layer distal most from the substrate 107) and a bottommost layer (e.g., a layer most proximate to the substrate 107) of the stack 108 may include an insulating layer 112. While M. 12 shows the stack 108 as including 5 insulating layers 112 and 4 sacrificial layers, the stack 108 may include any number of insulating layers 112 and sacrificial layers 111 (e.g., 4, 5, 6, 7, 8, or even more). In various embodiments, if the number of sacrificial layers 111 in the stack 108 is n, a number of insulating layers 112 in the stack 108 may be n+1.

Each of the plurality of insulating layers 112 may have about the same thickness, for example, in a range of about 5 nm to about 100 nm, inclusive, or any other suitable thickness. Moreover, the sacrificial layers 111 may have the same thickness or different thickness from the insulating layers 112. The thickness of the sacrificial layers 111 may range from a few nanometers to few tens of nanometers (e.g., in a range of 5 nm to 100 nm, inclusive, or any other suitable thickness).

The insulating layers 112 and the sacrificial layers 111 have different compositions. In various embodiments, the insulating layers 112 and the sacrificial layers 111 have compositions that provide for different oxidation rates and/or different etch selectivity between the respective layers. In some embodiments, the insulating layers 112 may be formed from SiO, and the sacrificial layers 111 may be formed from SiN. In various embodiments, the insulating layers 112 may be formed from any suitable first material (e.g., an insulating material) as described with respect to the semiconductor device 110, and the sacrificial layers 111 may be formed from a second material (e.g., also an insulating material) that is different from the first material. In some embodiments, the sacrificial layers may include SiN, $HfO_2$, $TaO_x$, $TiO_x$, $AlO_x$, or any other material that has a high etch selectivity relative to the insulating layers 112 (e.g., an etch selectivity ratio of at least 1:100, or any other suitable etch selectivity ratio). The sacrificial layers 111 are merely spacer layers that are eventually removed and do not form an active component of the semiconductor die 800.

In various embodiments, the insulating layers 112 and/or the sacrificial layers 111 may be epitaxially grown from the substrate 107. For example, each of the insulating layers 112 and the sacrificial layers 111 may be grown by a molecular beam epitaxy (MBE) process, a chemical vapor deposition (CVD) process such as a metal organic CVD (MOCVD) process, a furnace CVD process, and/or other suitable epitaxial growth processes. During the epitaxial growth, the crystal structure of the substrate 107 extends upwardly, resulting in the insulating layers 112 and the sacrificial layers 111 having the same crystal orientation as the substrate 107. In other embodiments, the insulating layers 112 and the sacrificial layers 111 may be grown using an atomic layer deposition (ALD) process.

Figure 13:
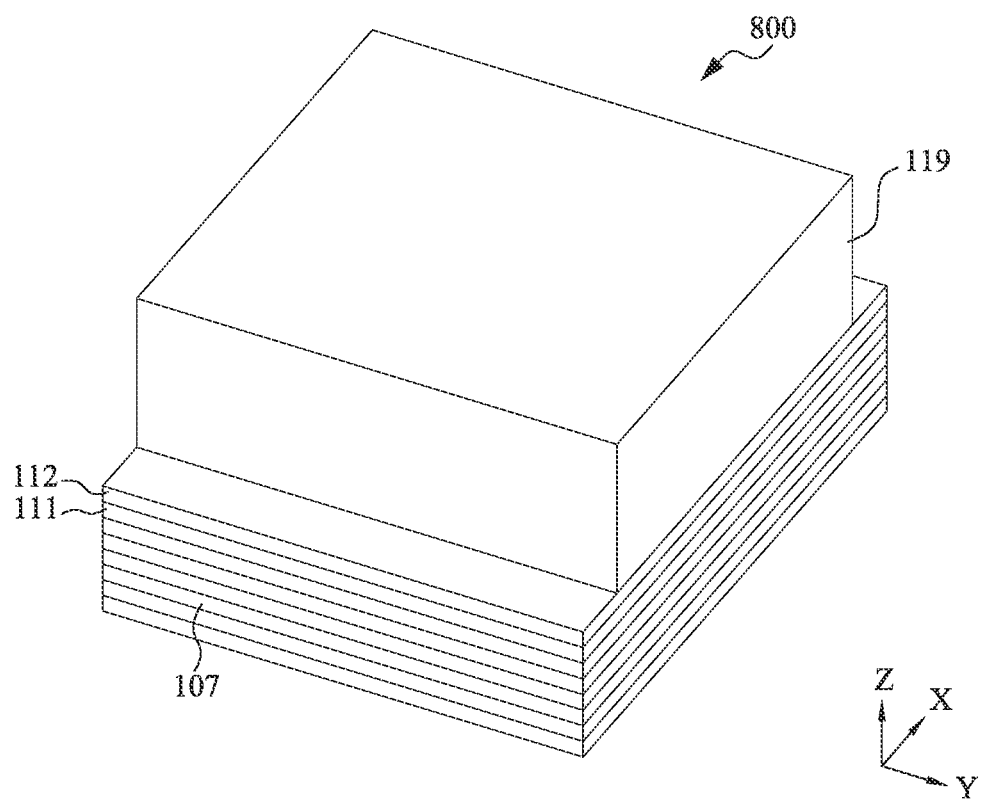

Operations 706 to 716 involve fabrication of interface portions that have a staircase or step profile in the Z-direction. For example, at operation 706, a mask layer (e.g., the mask layer 119 shown in FIG. 13) is deposited on the stack, and is patterned. For example, as shown in FIG. 13 that shows a top, perspective view of the stack 108, the mask layer 119 is deposited on the stack 108, i.e., on the topmost insulating layer 112. In some embodiments, the mask layer 119 may include a photoresist (e.g., a positive photoresist or a negative photoresist), for example, a single layer or multiple layers of the same photoresist or different photoresists. In other embodiments, the mask layer 119 may include a hard mask layer, for example, a polysilicon mask layer, a metallic mask layer, or any other suitable mask layer.

The mask layer 119 is patterned to etch portions of the mask layer 119 at axial ends off the mask layer 119 in the first direction (e.g., the X-direction), so as to reduce its axial width. The mask layer 119 may be patterned using photolithography techniques. Generally, photolithography techniques utilize a photoresist material that forms the mask layer 119 and that is deposited, irradiated (exposed), and developed to remove a portion of the photoresist material, in this instance, end portions of the mask layer 119. The remaining mask layer 119 protects the underlying material, such as a portion of the stack 108 below the patterned mask layer 119, from subsequent processing steps, such as etching.

Figure 14:
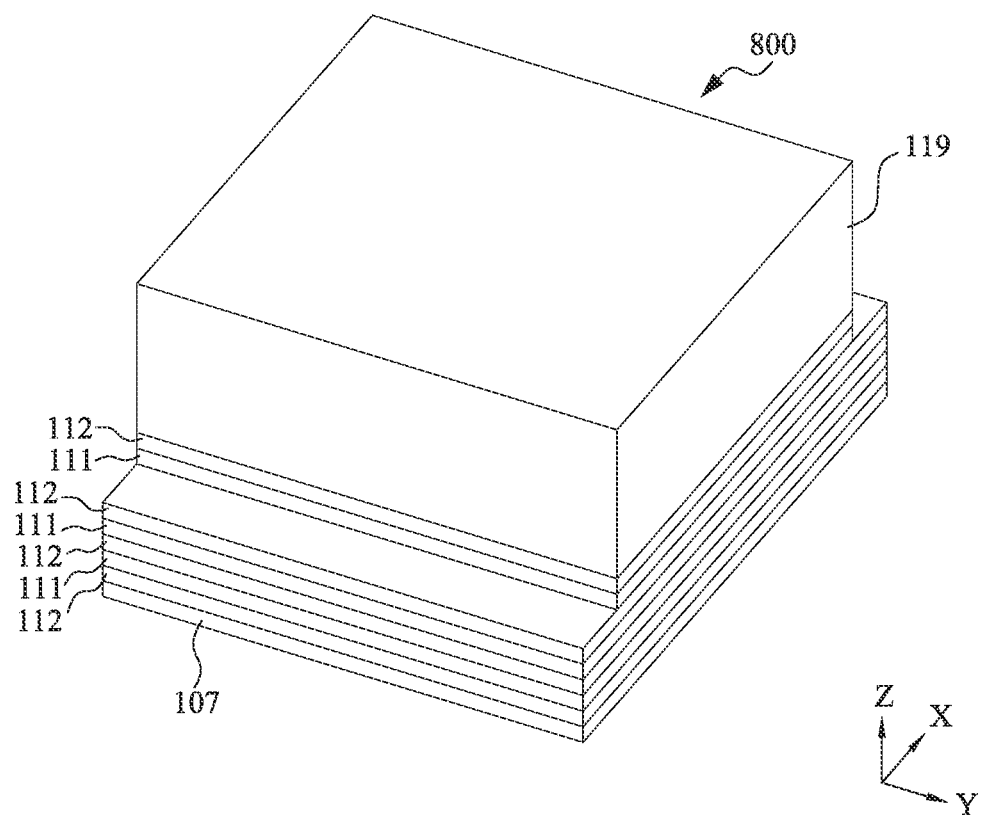

At operation 708, a first set or pair of insulating layers 112 and sacrificial layers 111 that include a topmost insulating layer 112 and a topmost sacrificial layer 111 on either side of the mask layer 119 in the first direction (e.g., the X-direction), are etched. Corresponding to operation 708, FIG. 14 is a top, perspective view of the semiconductor die 800 including the stack 108 after etching the topmost insulating layer 112 and the topmost sacrificial layer 111. As shown in FIG. 14, the patterned mask layer 119 is used to etch the exposed portions of the topmost insulating layer 112 and the topmost sacrificial layer 111 included in the first set so as to form a step from the first set to a second set of insulating and sacrificial layers 112, 111 that are disposed immediately below the first set. In some embodiments, the etch may be an anisotropic etch (e.g., a reactive ion etch (RIE), neutral beam etch (NBE), deep reactive ion etch (DRIE), and the like, or combinations thereof,) which selectively etches the exposed portions of the topmost insulating and sacrificial layers 112, 111 in the Z-direction.

In some embodiments, the etching of the first set may include a first etch that selectively etches the insulating layer 112 until the underlying sacrificial layer 111 is exposed, and a second subsequent etch that etches the sacrificial layer 111 until the underlying insulating layer 112 is exposed. Such two-step etching process may allow the underlying sacrificial layer 111 or the insulating layer 112 to serve as a etch stop such that once a portion of the layer immediately above it has been removed, so as to prevent over-etching.

Figure 15:
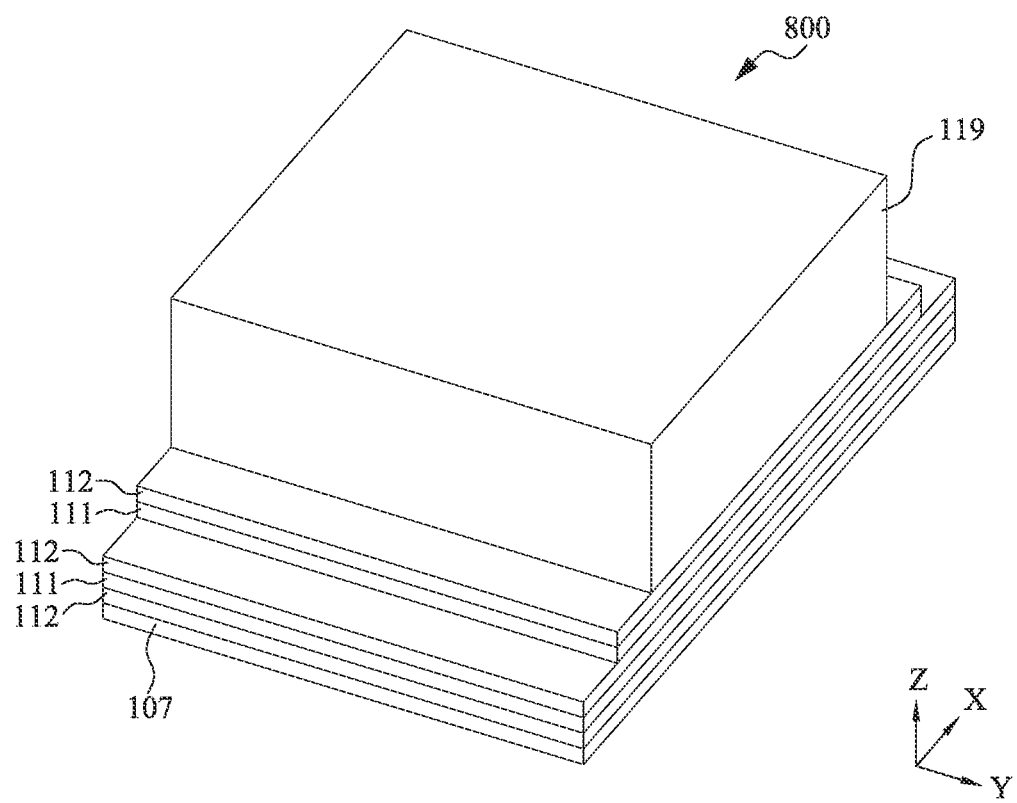

At operation 710, the mask layer 119 is again etched to reduce its width in the X-direction. Corresponding to operation 710, FIG. 15 is a top, perspective view of the semiconductor die 800 after etching the mask layer 119. As shown in FIG. 15, axial ends of the mask layer 119 may be etched using the same process as described with respect to operation 706. In some embodiments, a width of the portion of the mask layer 119 that is etched and removed at operation 710 is the same as a width of a portion of the mask layer 119 that is etched and removed at operation 706.

Figure 16:
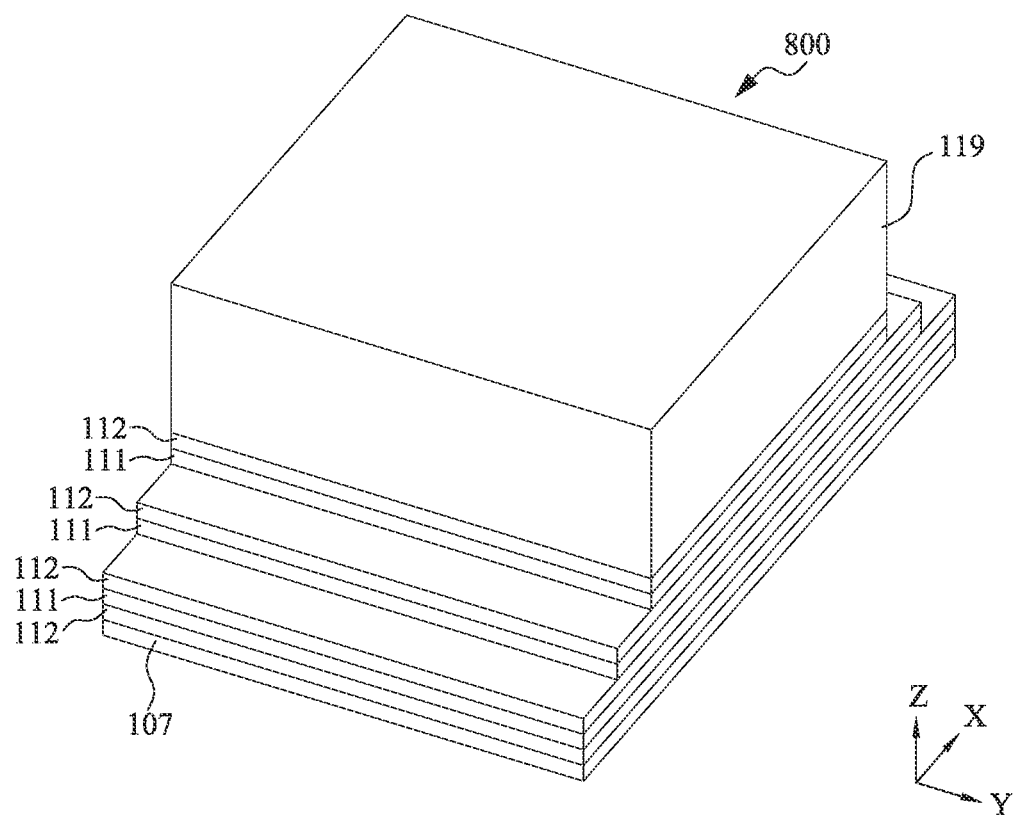

At operation 712, the first set of the insulating layer and the sacrificial layer, and the second set of the insulating layer and the sacrificial layer are etched. Corresponding to operation 712, FIG. 16 is a top, perspective view of the semiconductor die 800 after etching the first and second sets. As shown in FIG. 16, the first set of the insulating layer 112 and the sacrificial layer 111, and the second set of the insulating layer 112 and the sacrificial layer 111 are etched using the same process as described with respect to operation 708, so as to also form a step from the second set to a third set of insulating and sacrificial layers 112, 111 immediately below the second set. Moreover, the etching also causes a reduction in the length of the first set of insulating and sacrificial layers 112, 111, and the second set of insulating and sacrificial layers 112, 111, in the X-direction. The reduction in length of these layers is proportional to the reduction in width of the mask layer 119 at operation 610 in the X-direction.

Figure 17:
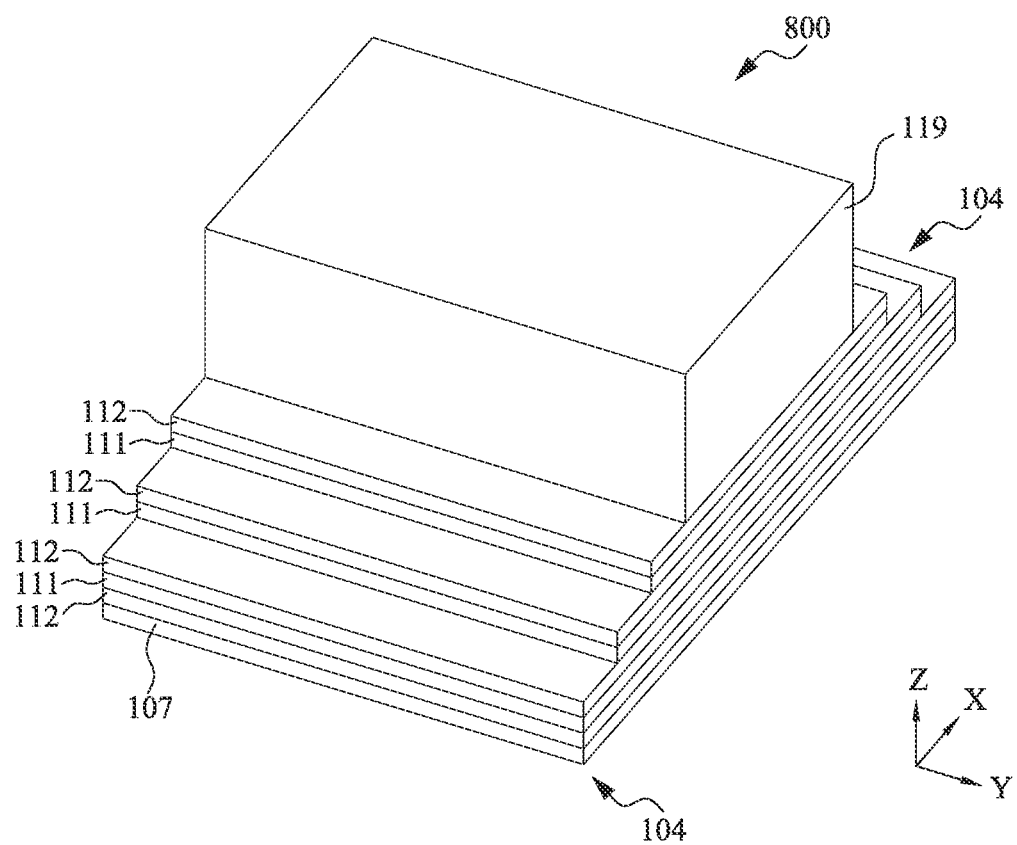

At operation 714, the operations 706-712 are repeated so as to form axial ends of the stack that have a staircase profile on either side of the mask layer 119. For example, corresponding to operation 714, FIG. 17 shows a top, perspective view of the semiconductor die 800. As shown in FIG. 17, operations 706-712 are repeated, until steps are formed from a bottommost set of insulating and sacrificial layers 112, 111 to the first set of insulating and sacrificial layers 112, 111, and axial end portions 104 of the stack 108 in the first direction (e.g., the X-direction) have a staircase profile in the vertical direction (e.g., the Z-direction), from the bottommost set to the first set (i.e., the topmost set) of insulating and sacrificial layers 112, 111. It should be appreciated that the bottommost insulating layer 112 is not included in the bottommost set of insulating and sacrificial layers 112, 111.

Figure 18:
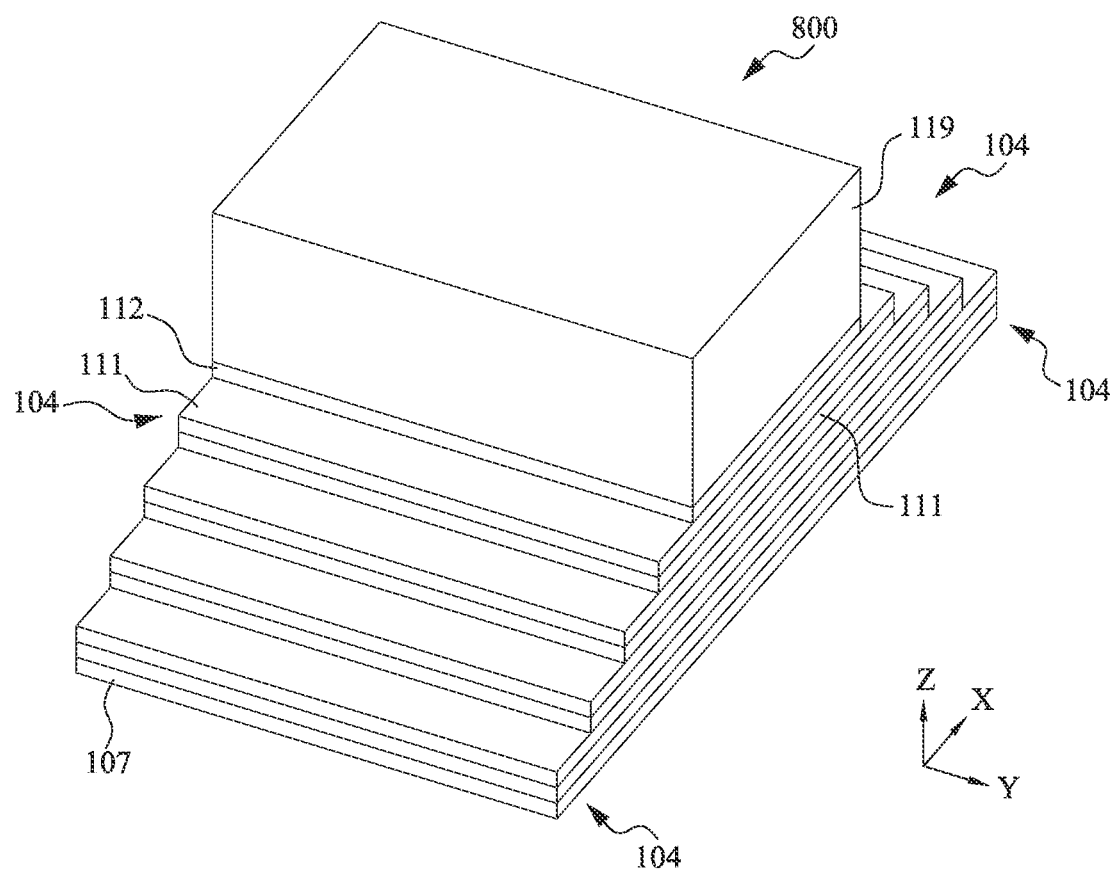
Figure 19:
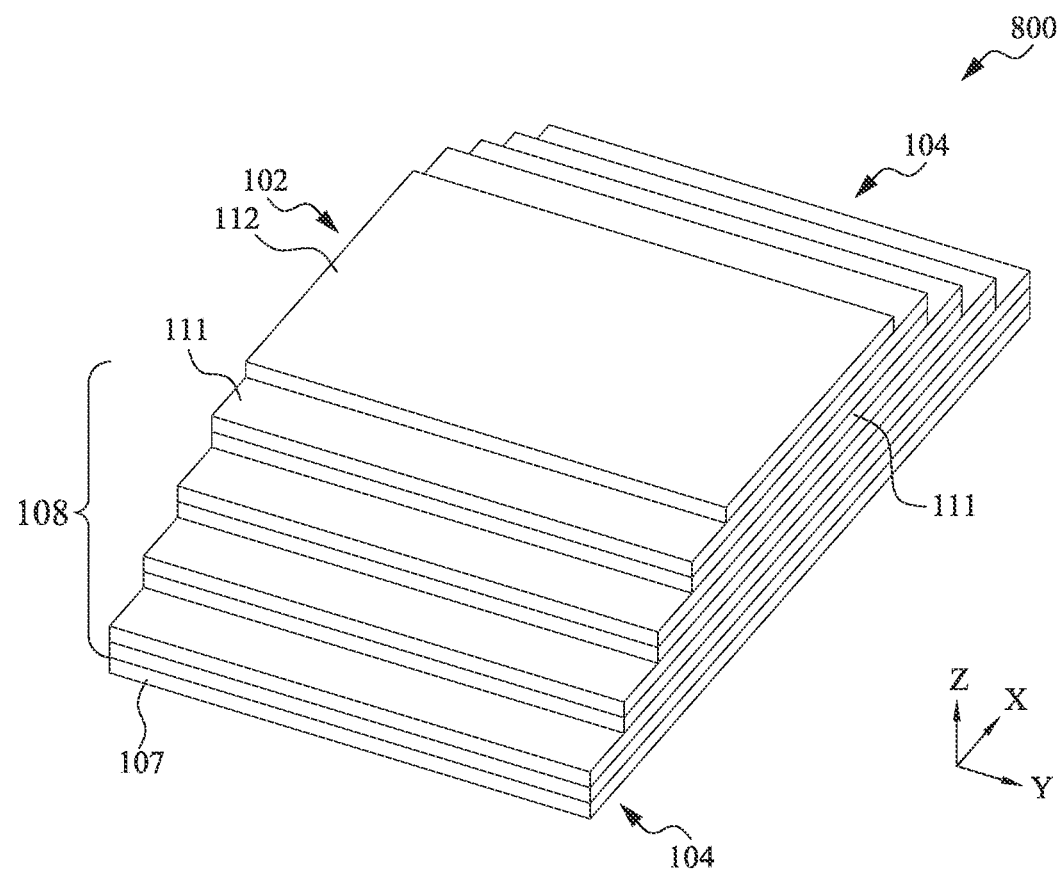

At operation 716, exposed portions of the insulating layers 112 are etched. Corresponding to operation 716, FIG. 18 is a top, perspective view of the semiconductor die 800. As shown in FIG. 18, the exposed portions of the insulating layers 112 included in the axial end portions 104 of the stack 108 on either side of the mask layer 119 in the X-direction are selectively etched (e.g., using an anisotropic etch such as RIE, NBE, DRIE, and the like, or combinations thereof.) For example, the mask layer 119 may be etched to reduce its width and exposed portion of the insulating layers 112 on either side of the mask layer 119 are etched to expose a portion of each sacrificial layer 111 that is located in the axial end portions 104 below the etched portions of the insulating layers 112. The axial end portions 104 form the interface portions 104 of the semiconductor die 800, as shown in FIG. 18. The mask layer 119 is then removed (e.g., via an isotropic etch in solvent or etchant) as shown in FIG. 19, which leaves a stack 108 of insulating layers 112 and sacrificial layers 111 alternatively stacked on top of one another, and having a central device portion 102 and interface portions 104 disposed on axial ends of the device portion 102. The interface portions 104 have a staircase profile in the vertical direction. An array of semiconductor devices 110 (e.g., memory devices) are formed in the device portion 102 of stack 108 located between the axial end portions 104, and gate vias and interface vias are formed in the interface portions 104 in later operations described herein.

Figure 20:
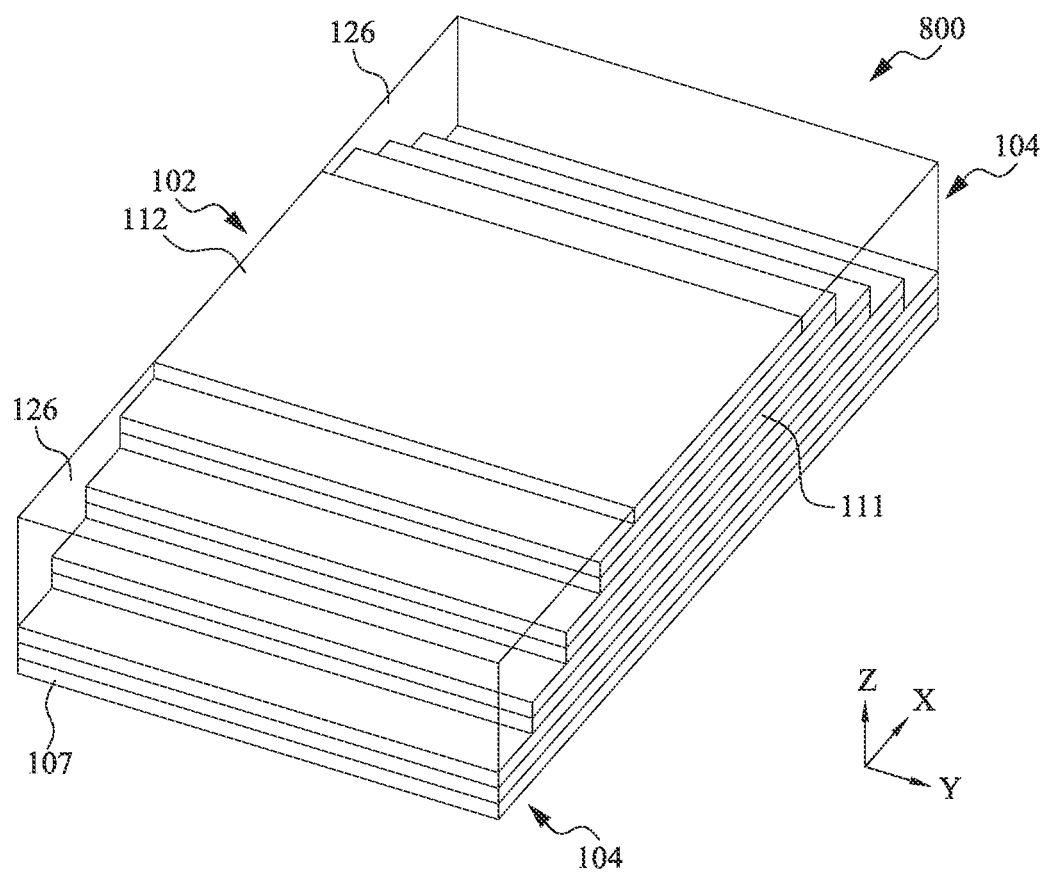

At operation 718, an ILD is deposited on the axial ends of the stack that have the staircase profile. Corresponding to operation 718, FIG. 20 is a top, perspective view of the semiconductor die 800 after formation of the ILD 126. The ILD 126 is deposited on the interface portions 104. The ILD 126 can be formed by depositing a dielectric material in bulk over the partially formed semiconductor die 800 (e.g., a 3D memory device), and polishing the bulk dielectric back (e.g., using chemical-mechanical polishing (CMP) to level off the topmost insulating layer 112 such that the ILD 126 is disposed only on the interface portions 104. The dielectric material of the ILD 126 may include SiO, phosphosilicate glass (PSG), borosilicate glass (BSG), boron-doped phosphosilicate Glass (BPSG), undoped silicate glass (USG), or combinations thereof.

Figure 21A:
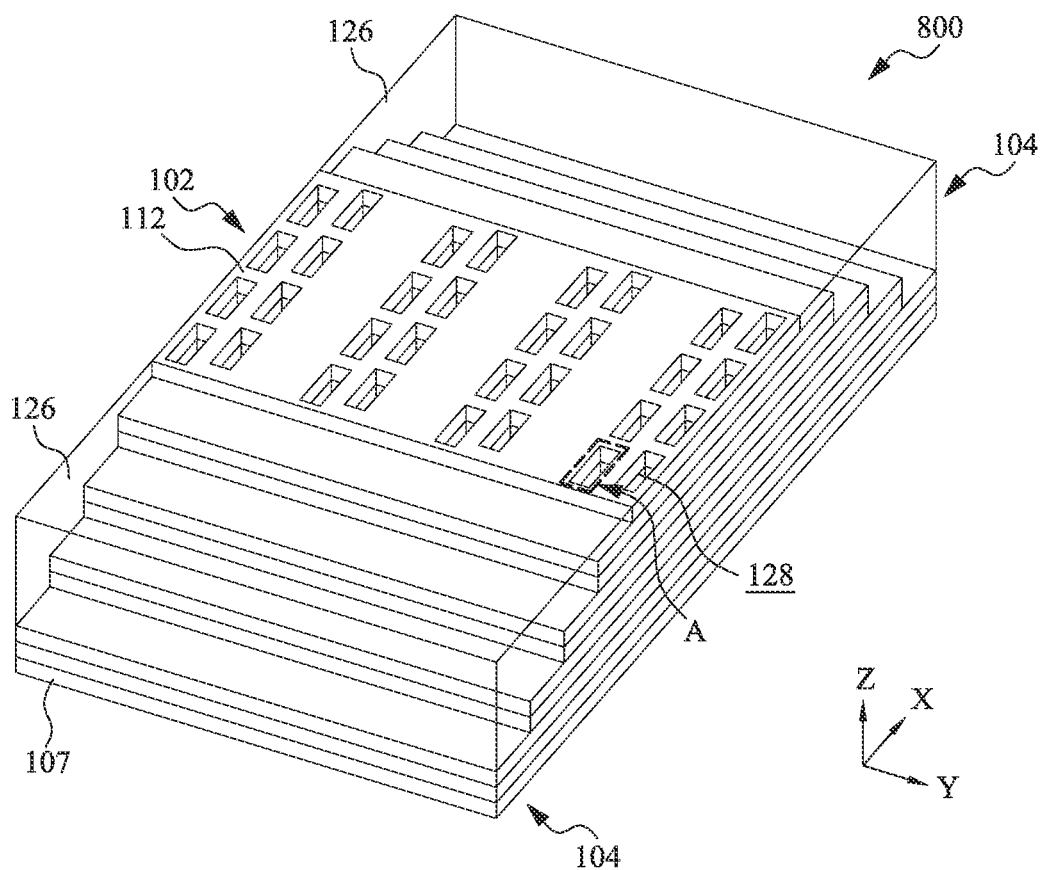
Figure 21B:
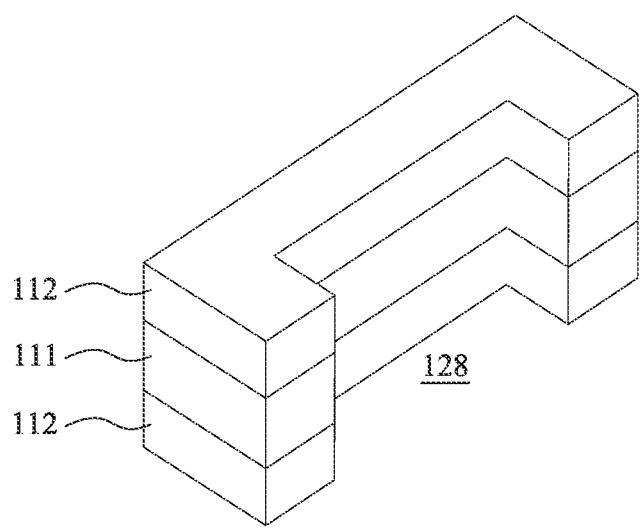

At operation 720, a plurality of cavities are formed through the stack in the first direction (e.g., the X-direction), the plurality of cavities extending from the top of the stack 108 to the substrate 107. Corresponding to operation 720, FIG. 21A is a top, perspective view of the semiconductor die 800 after a plurality of cavities 128 extending in the Z-direction have been formed through the stack 108, and FIG. 21B is a side cross-section view of a portion of the semiconductor device indicated by the arrow A in FIG. 21A. The etching process for forming the plurality of cavities 128 may include a plasma etching process, which can have a certain amount of anisotropic characteristic. For example, the cavities 128 may be formed, for example, by depositing a photoresist or other masking layer on a top surface of the semiconductor die 800, i.e., the top surface of the topmost insulating layer 112 of the stack 108 and a top surface of the ILD 126, and a pattern corresponding to the cavities 128 defined in the masking layer (e.g., via photolithography, e-beam lithography, or any other suitable lithographic process) over the device portions 102. In other embodiments, a hard mask may be used.

Subsequently, the device portion 102 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the cavities 128. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. The etch used to form the plurality of cavities 128 etches through each of the sacrificial layers 111 and insulating layers 112 of the stack 108 such that each of the plurality of cavities 128 extend form the topmost insulating layer 112 through the bottommost insulating layer 112 to the substrate 107.

Figure 22A:
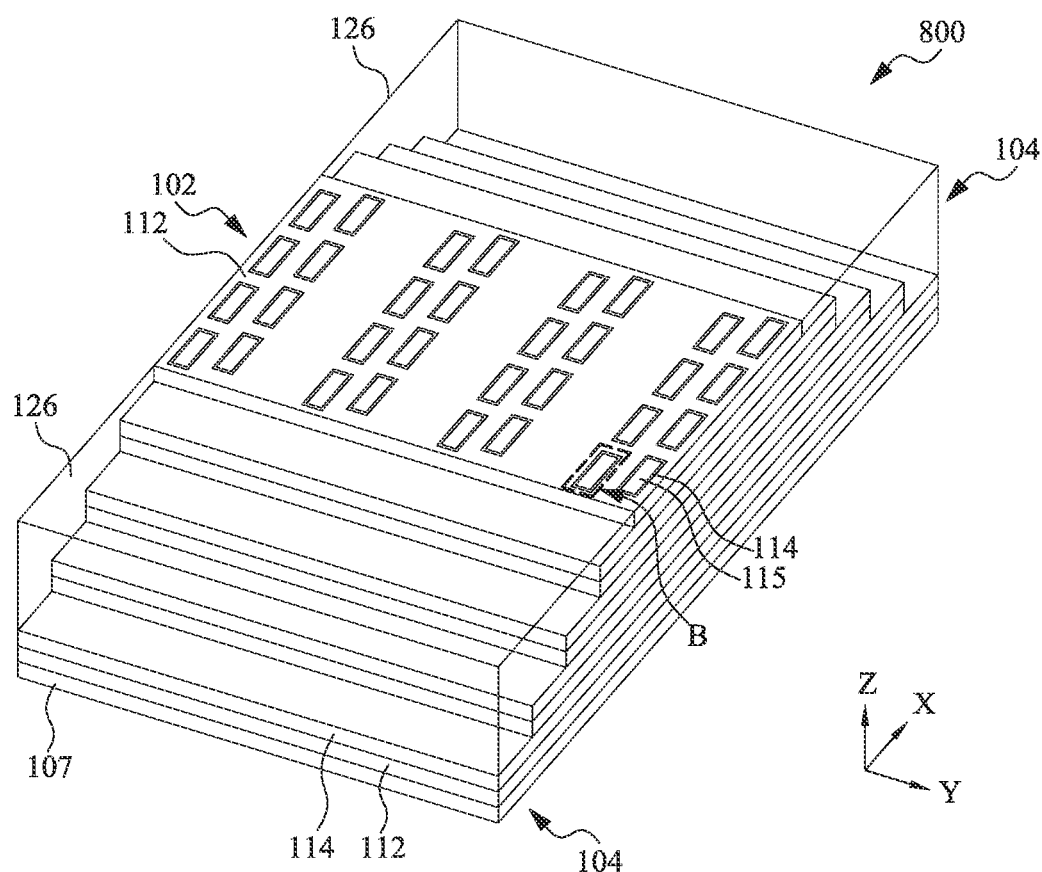
Figure 22B:
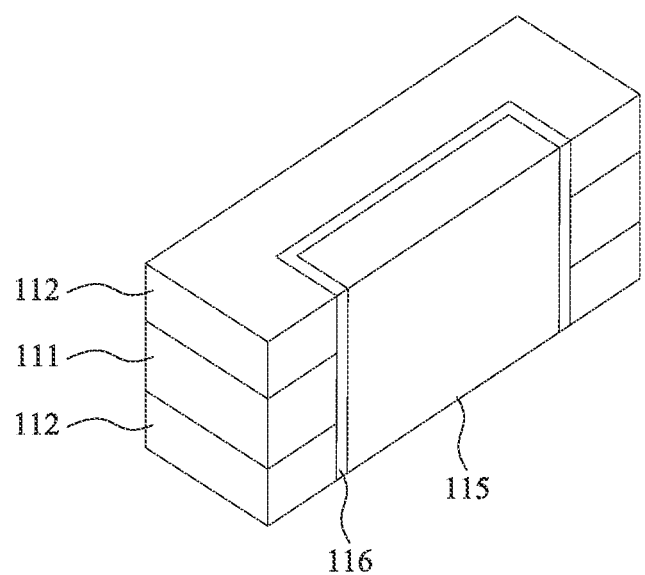

At operation 722, a channel layer is formed on the walls of the plurality of cavities such that the channel layer extends from a top surface of the semiconductor die to the substrate. At operation 724, an insulating material is deposited in the plurality of cavities so as to fill the plurality of cavities with the insulating material to form an inner spacer structure. Corresponding to operations 722-724, FIG. 22A is a top perspective view of the semiconductor die 800 after forming the channel layer 116 and the inner spacer structure 115, and FIG. 22B is a side cross-section view of a portion of the semiconductor die 800 indicated by the arrow B in FIG. 22A.

The channel layer 116 is formed on inner walls of each of the plurality of cavities 128. In some embodiments, the channel layer 116 may be formed from a semiconductor material, for example, Si (e.g., polysilicon or amorphous silicon), Ge, SiGe, silicon carbide (SiC), IGZO, ITO, IZO, ZnO, IWO, any other suitable material or combination thereof. The channel layer 116 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the channel layer 116 is continuous on the walls of each of the plurality of cavities 128.

Each of the plurality of cavities 128 is then filled with an insulating material (e.g., SiO, SiN, SiON, SiCN, SiC, SiOC, SiOCN, the like, or combinations thereof) so as to form the inner spacer structure 115. In some embodiments, the inner spacer structure 115 may be formed from the same material as the plurality of insulating layers 112 (e.g., $SiO_2$). The inner spacer structure 115 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof.

Figure 23A:
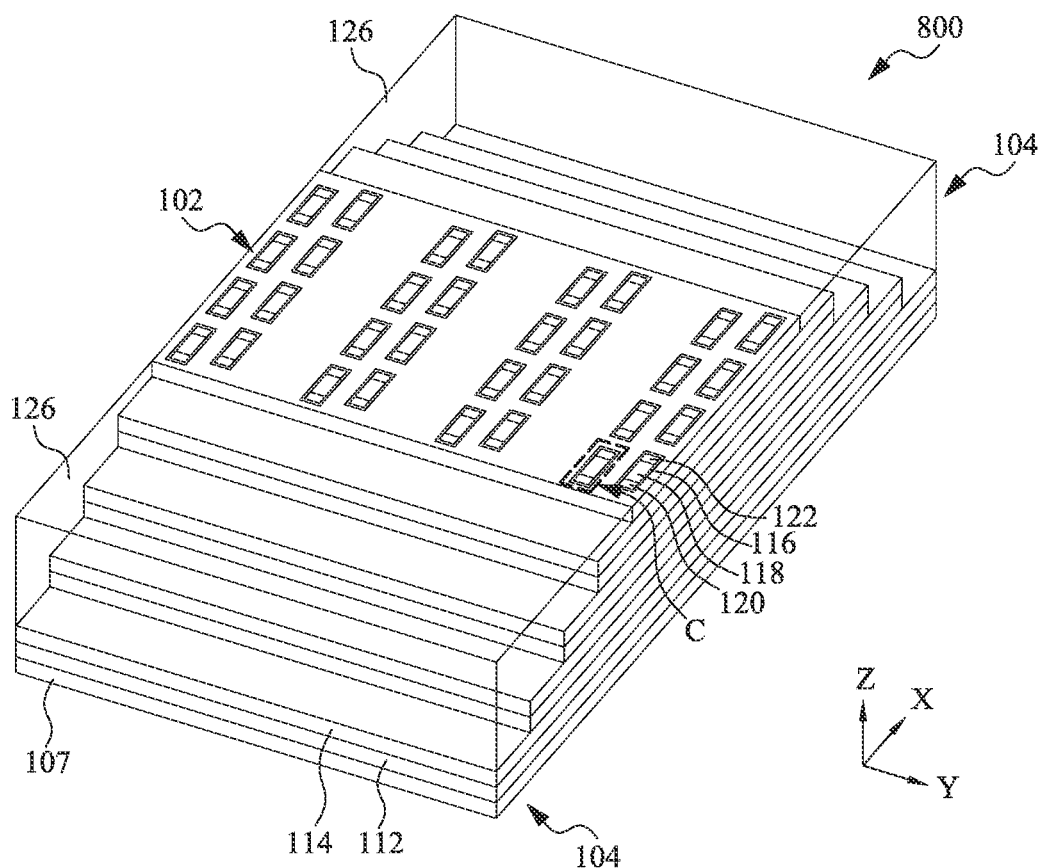
Figure 23B:
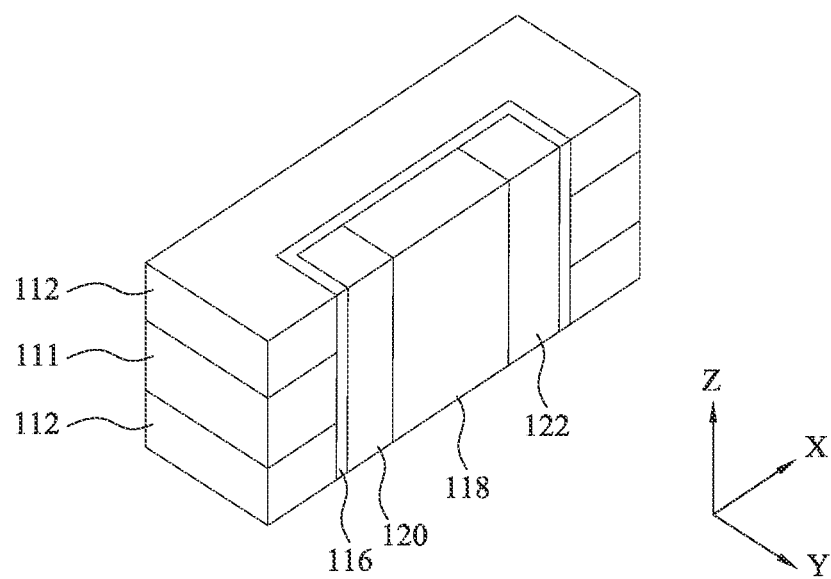

At operation 728, a source and a drain are formed at axial ends of the inner spacer structure such that the source and drain are spaced apart by the inner spacer. Corresponding to operation 728, FIG. 23A is a top perspective view of the semiconductor die 800 after forming the source 120 and the drain 122, and FIG. 23B is a side cross-section view of a portion of the semiconductor die 800 indicated by the arrow C in FIG. 23A. To form the source 120 and the drain 122, second cavities are etched at axial ends of the inner spacer structure 115 up to the substrate, which forms the inner spacer 118. The second cavities may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the second cavities. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

A source material and a drain material are deposited in the second cavities to form the source 120 and the drain 122. The source 120 and the drain 122 may be formed by depositing the source material and the drain material (e.g., metals such as Al, Ti. TiN, TaN, Co, Ag, Au, Cu, Ni, Cr, Hf, Ru, W, Pt, WN, Ru, or any other suitable metal, or a semiconductor such as IGZO, ITO, IWO, poly Si, amorphous Si, or any other suitable material or combination thereof) respectively in the second cavities using an epitaxial growth process, physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. In-situ doping (ISD) may be applied to form doped source 120 and/or drain 122. In various embodiments, N-type and p-type FETs are formed by implanting different types of dopants to selected regions (e.g., the source 120 or the drain 122) to form the junction(s). N-type devices can be formed by implanting arsenic (As) or phosphorous (P), and p-type devices can be formed by implanting boron (B). The source 120 and the drain 122 are located on either side of inner spacer 118 and separated from each other by the inner spacer 118, and extend from a top surface of the semiconductor die 800 to the substrate 107. Moreover, outer surfaces of the source 120, the drain 122 and the inner spacer 118 are in contact with the channel layer 116.

Figure 24:
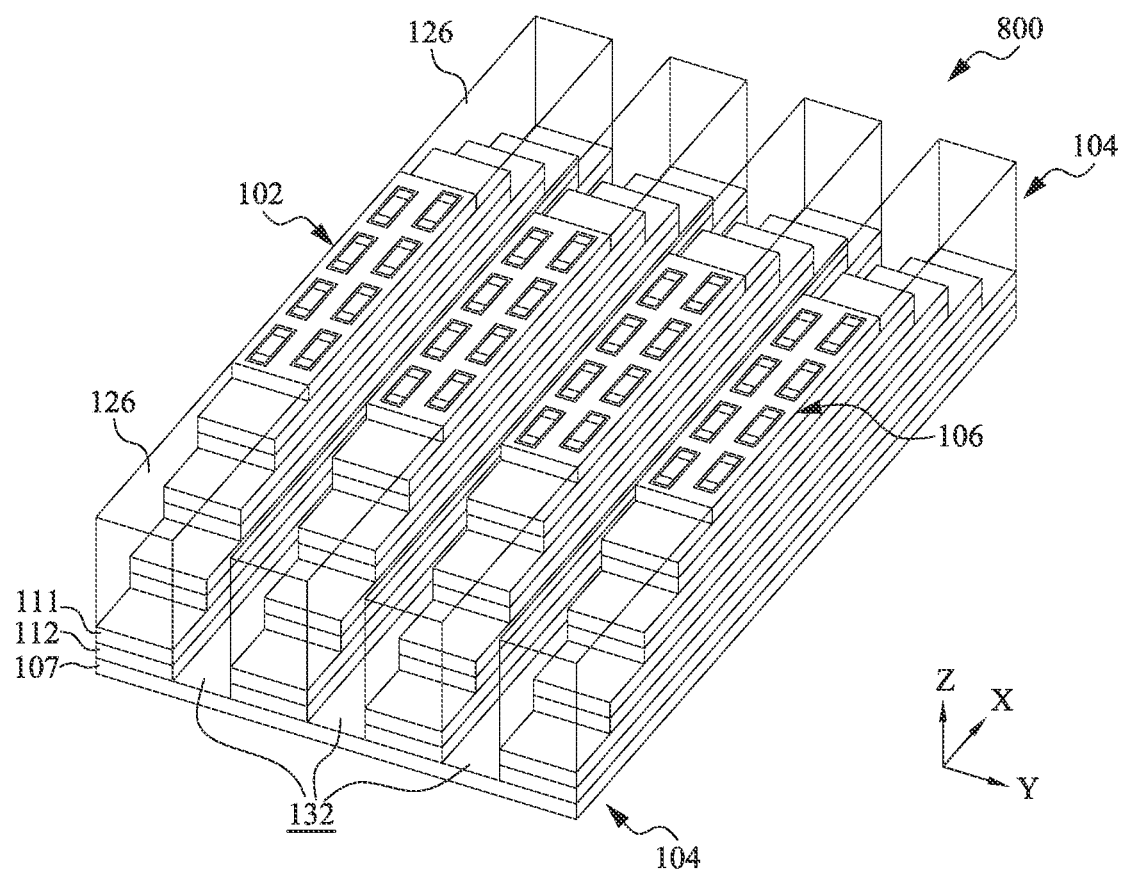

At operation 728, a plurality of trenches are formed through the stack in the first direction (e.g., the X-direction). Corresponding to operation 728, FIG. 24 is a top, perspective view of the semiconductor die 800 after forming a plurality of trenches 132 extending through the stack 108 in the X-direction from the device portion 102 to the interface portion 104. The plurality of trenches extend in the X-direction and are spaced apart from each other in the Y-direction. The plurality of trenches 132 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the plurality of trenches 132. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Figure 25A:
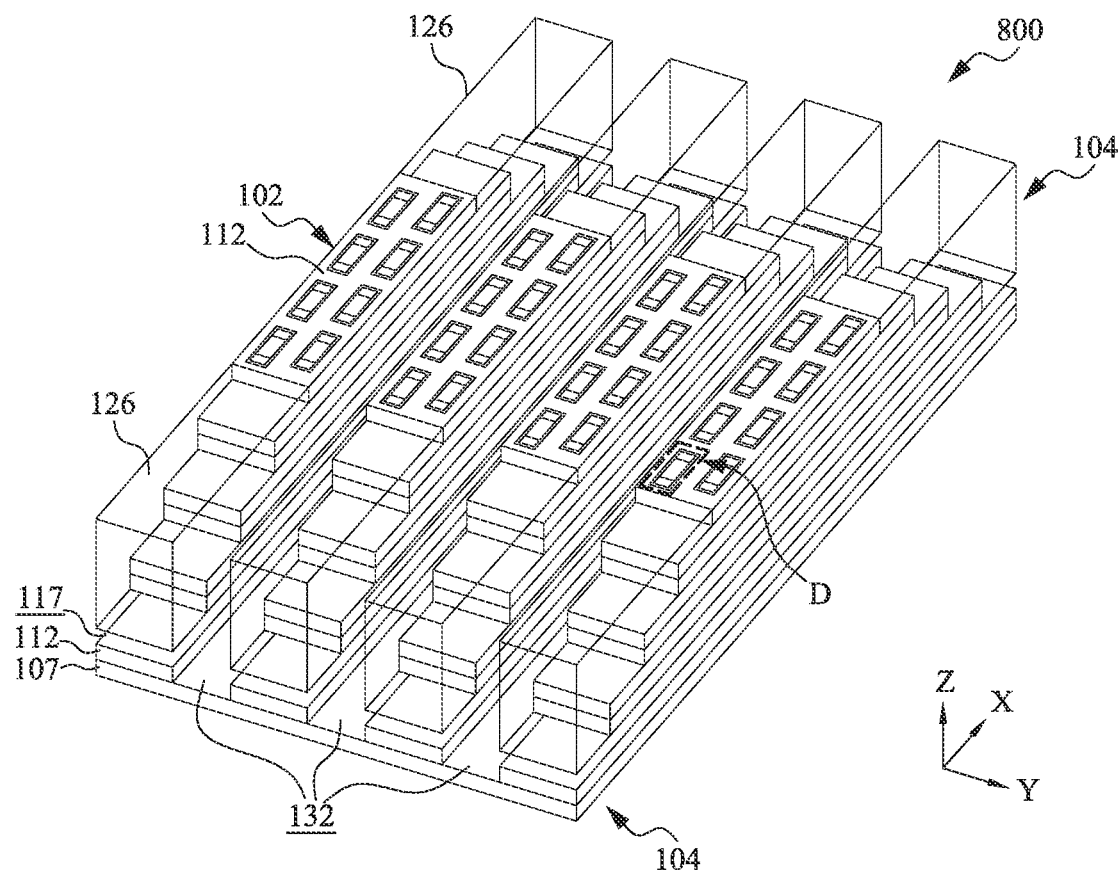
Figure 25B:
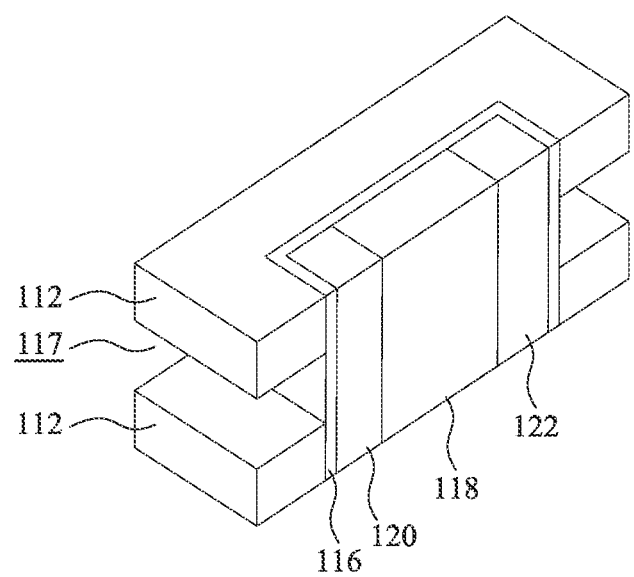

At operation 730, the sacrificial layers are removed. Corresponding to operation 730, FIG. 25A is a top, perspective view of the semiconductor die 800 and FIG. 25B is a side cross-section view of a portion of the semiconductor die 800 indicated by the arrow D in FIG. 25A, after removing the sacrificial layers 111. For example, forming of the plurality of trenches 132 exposes side walls of the sacrificial layers 111 allowing etching and removal of the sacrificial layers 111.

In some embodiments, the sacrificial layers 111 may be etched using a wet etch process (e.g., hydrofluoric etch, buffered hydrofluoric acid). In other embodiments, the exposed surfaces of the sacrificial layers 111 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. Removal of the sacrificial layers 111 causes third cavities 117 to be formed between adjacent insulating layers boundaries, i.e., between top and bottom surfaces of adjacent insulating layers 112, and a portion of the third cavities 117 being bounded by the channel layers 116.

Figure 26A:
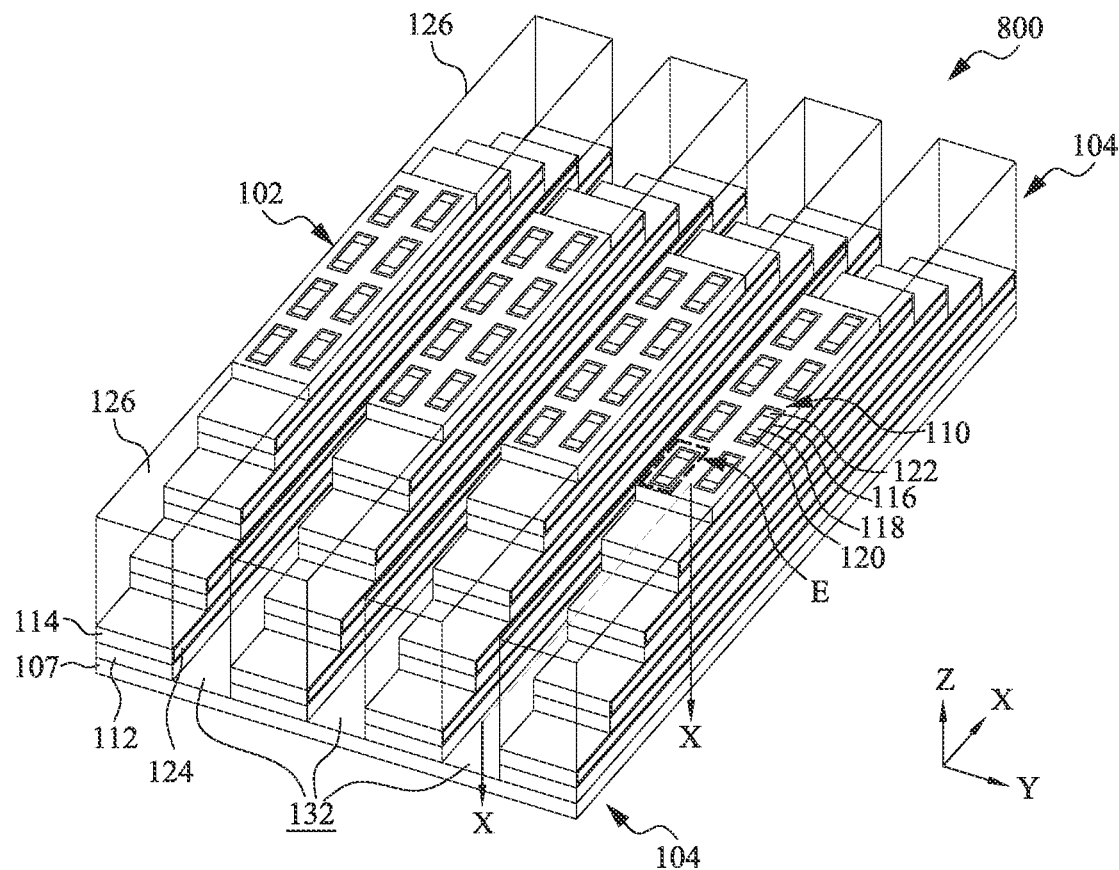
Figure 26B:
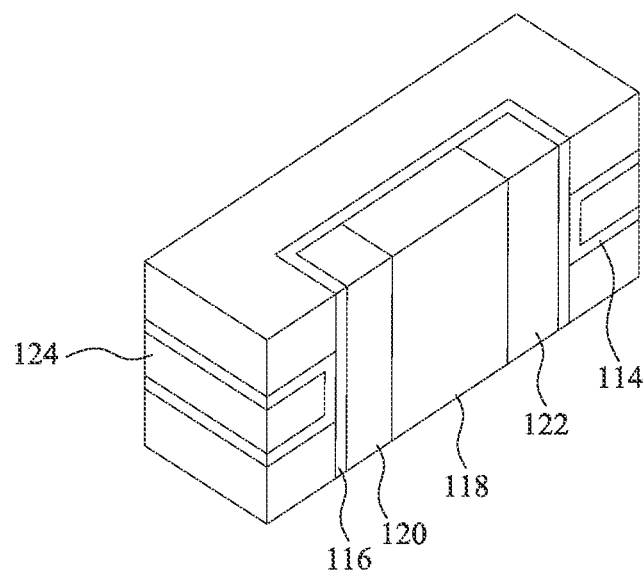
Figure 26C:
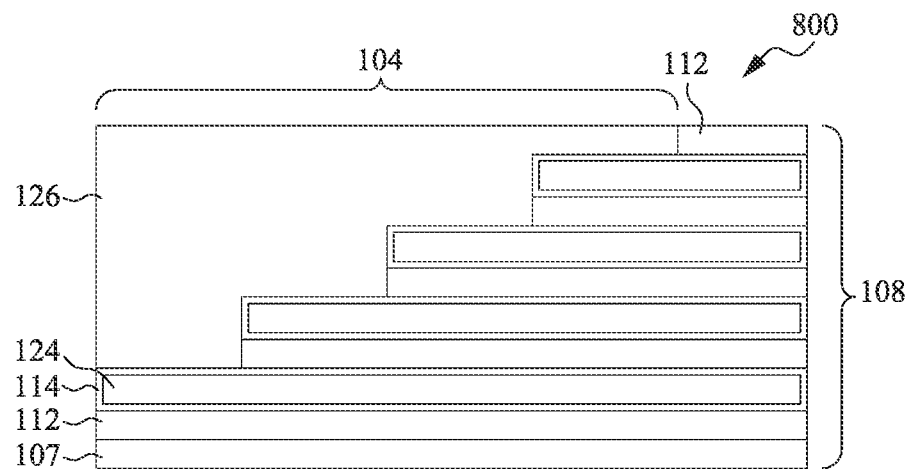

At operation 732, a plurality of memory layers are formed on walls of the insulating layers that face another insulating layer, and also on outer exposed surfaces of the channel layer. At operation 734, a plurality of gate layers are formed in the third cavities between the insulating layers such that a memory layer is interposed between each of the plurality of gate layers and a corresponding insulating layer. Corresponding to operation 732-734, FIG. 26A is a top, perspective view of the semiconductor die 800, FIG. 26B is a side cross-section view of a portion of the semiconductor die 800 indicated by the arrow E in FIG. 26A, and FIG. 26C is a side cross-section view of the interface portion 104 of the semiconductor die 800 taken along the line X-X in FIG. 26A, after forming the memory layers 114 and the gate layers 124.

The memory layer 114 may include a ferroelectric material, for example, lead zirconate titanate (PZT), $PbZr/TiO_3$, $BaTiO_3$, $PbTiO_2$, $HfO_2$, $Hr1-xZ_{rx}O_2$, $ZrO_2$, $TiO_2$, $NiO$, $TaO_x$, $Cu_2O$, $Nb_2O_5$, $AlO_x$, etc. The memory layer 114 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the memory layer 114 is continuous on the walls of the third cavities 117 that are bounded by insulating layers 112, and also include portions bounded by the ILD 126 in the interface portions 104 (e.g., in the X-Y plane and the Y-Z plane), and bounded by the channel layer 116 in the device portion 102 (e.g., in the X-Z plane and Y-Z plane). In some embodiments, each memory layer 114 may include a single layer or a plurality of layers (e.g., 2, 3, or even more). In other embodiments, each memory layer 114 may include multiple layers, each layer of the multiple layers being formed from the same material or different materials.

The gate layers 124 may be formed by filling a gate dielectric and/or gate metal in the third cavities 117 between memory layers 114, such that the gate layers 124 inherit the dimensions and profiles of the third cavities 117. In various embodiments, the gate layers 124 may be formed from a high-k dielectric material. Although, each of gate layer 124 shown in FIGS. 26A-26B is shown as a single layer, in other embodiments, the gate layer 124 can be formed as a multilayer stack (e.g., including a gate dielectric layer and a gate metal layer), while remaining within the scope of the present disclosure. The gate layers 124 may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate layers 124 can be deposited using any suitable method, including, for example, molecular beam deposition (MBD), atomic layer deposition (ALD), PECVD, and the like.

The gate metal may include a stack of multiple metal materials. For example, the gate metal may be a p-type work function layer, an n-type work function layer, multi-layers thereof, or combinations thereof (e.g., Al, Ti, TiN, TaN, Co, Ag, Au, Cu, Ni, Cr, Hf, Ru, W, Pt, WN, any other suitable metal or combination thereof). The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

Formation of the memory layers 114 and the gate layers 124 in the third cavities 117 may cause the memory material and the gate metal to be deposited on exposed surfaces of the substrate 107 as well side walls of the insulating layers 112 facing the plurality of trenches 132. The extra memory material and the gate metal is etched, for example, using a selective wet etching or dry etching process (e.g., RIE, DRIE, etc.) until any gate material and memory material deposited on the axial surfaces of the insulating layers 112 that face the trenches, and a top surface of the substrate 107 are removed such that axial edges of the gate layers 124 and the memory layers 114 facing the trenches 132 are substantially axially aligned with corresponding axial edges of the insulating layers 112. Formation of the gate layers 124 result in formation of the array of semiconductor devices 110 (e.g., memory devices) in the device portion 102. The gate layers 124 and the memory layers 114 extend from the device portion 102 to the interface portions 104 such that a memory layer 114 is interposed between each of the gate layers 124 and the insulating layers 112. Moreover, as shown in FIG. 26C, in the interface portion 104, a portion of the memory layers 114 is bounded by the ILD 126.

Figure 27:
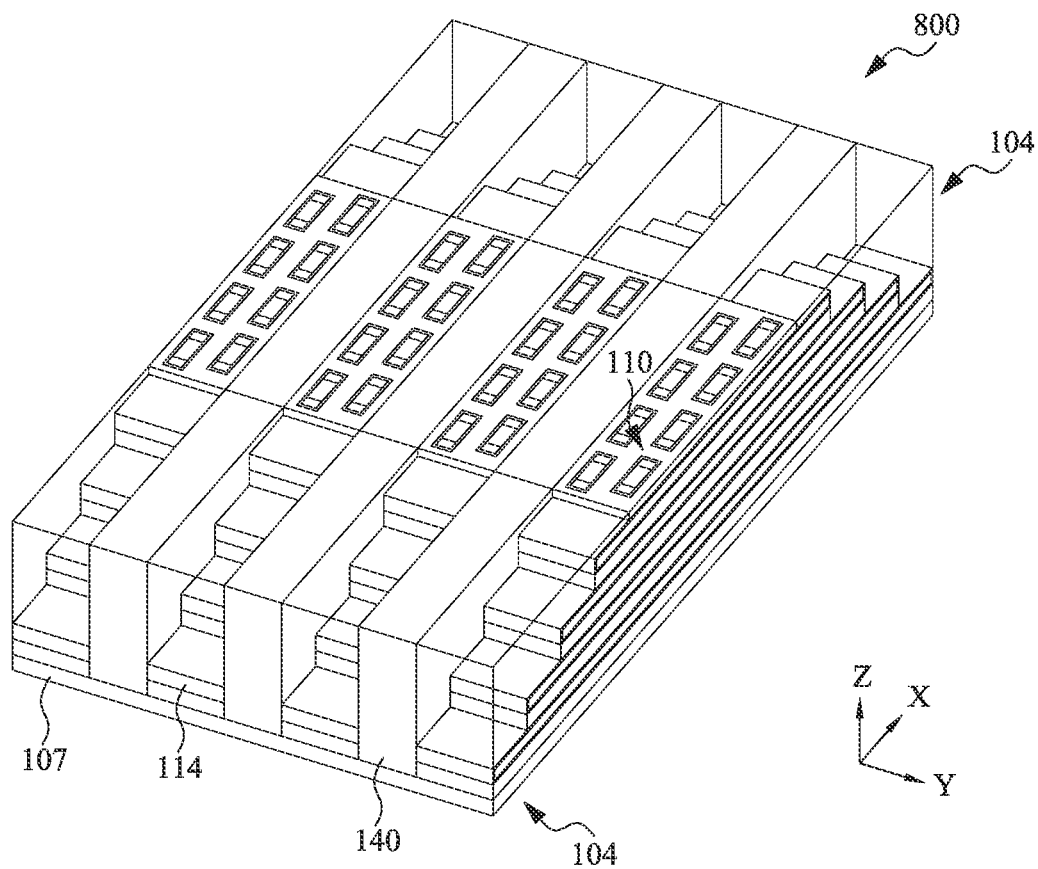

At operation 736, a plurality of insulation structures are formed in the plurality of trenches 132. Corresponding to operation 736, FIG. 27 is a top, perspective view of the semiconductor die 800 after forming the plurality of insulation structures 140. The plurality of insulation structures 140 may be formed by depositing an insulating material in the plurality of trenches 132 using any suitable method, for example, molecular beam deposition (MBD), atomic layer deposition (ALD), CVD, PEVVD, MOCVD, epitaxial growth, and the like. The insulation structure 140 may include $SiO_2$, SiON, SiN, SiCN, $HfO_2$, $TaO_x$, $TiO_x$, $AlO_x$, etc. In some embodiments, the insulating material used to form the insulation structures 140 may be same as the material of the insulating layers 112. A CMP operation may be performed after forming the insulation structures 140 remove any extra insulation material that may be deposited on the top surface of the semiconductor die 800.

Figure 28A:
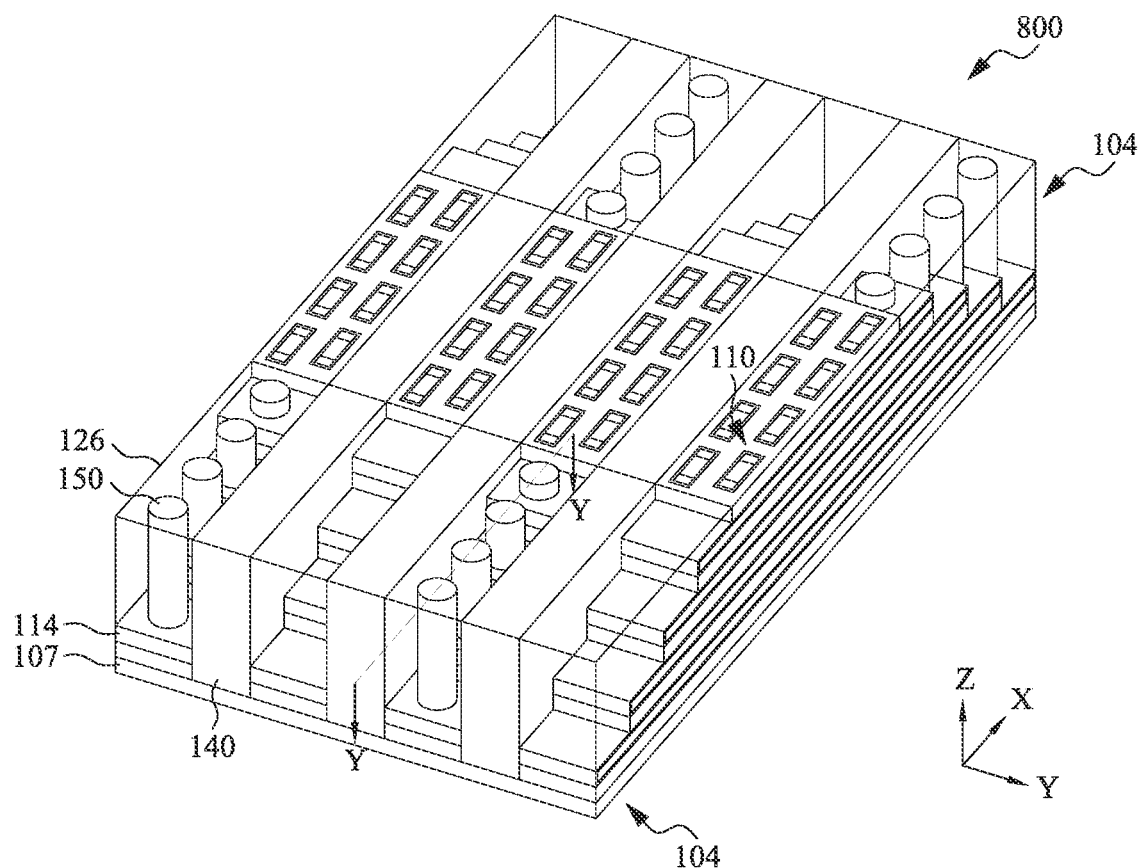
Figure 28B:
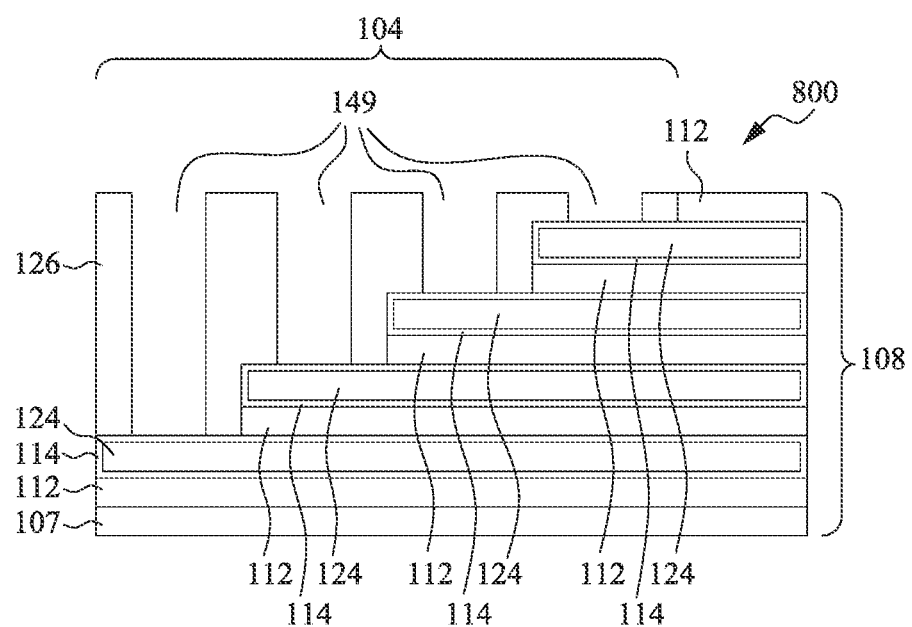
Figure 28C:
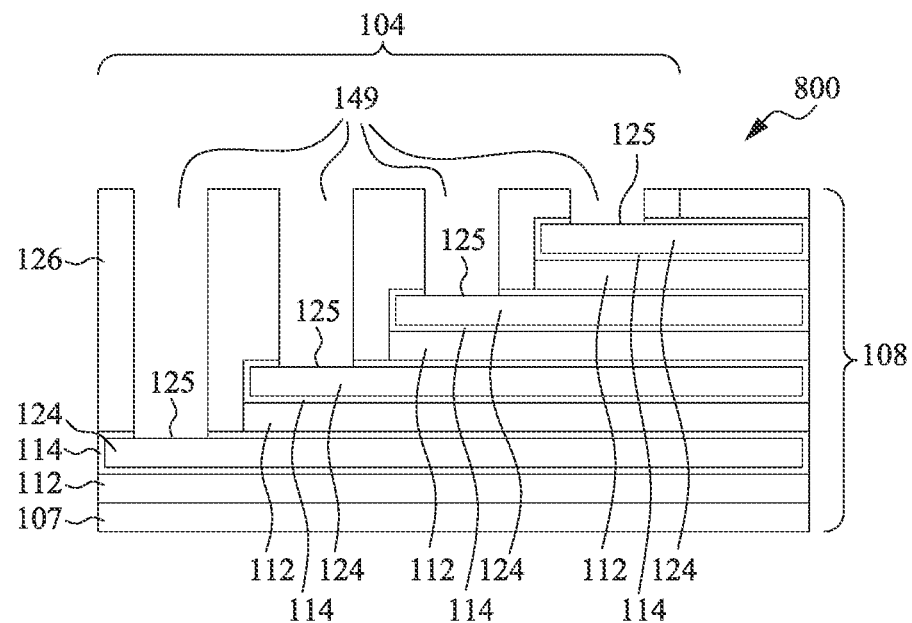
Figure 28D:
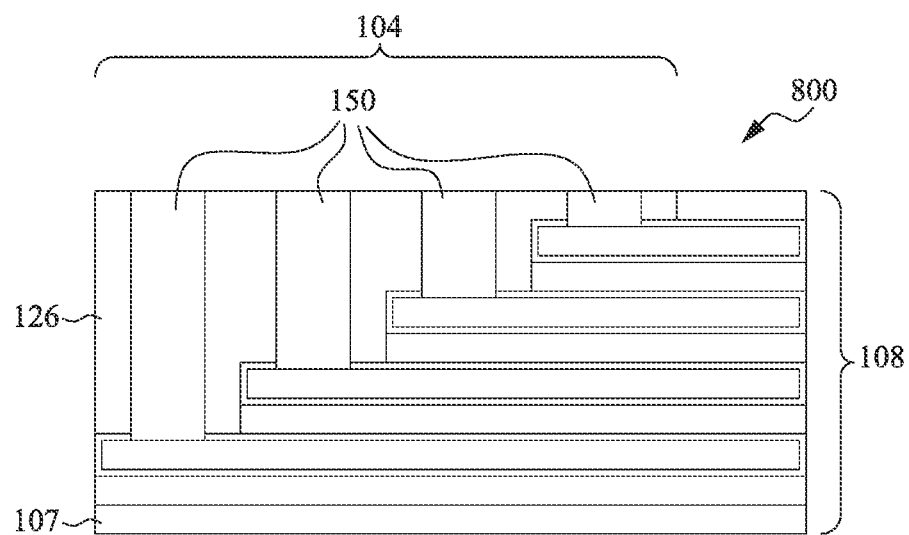

At operation 738, gate vias are formed in the interface portion. Corresponding to operation 738, FIG. 28A is a top, perspective view of the semiconductor die 800, and FIGS. 28B-28D are side cross-section views of the semiconductor die 800 taken along the line Y-Y shown in FIG. 28A at various stages of fabrication of the gate vias 150. As shown in FIG. 28B, the fabrication of the gate vias 150 includes forming a plurality of ILD cavities 149 in the ILD 126 up to each of the memory layers 114. The plurality of ILD cavities 149 may be formed using a selective etching process (e.g., a plasma etching process), which can have a certain amount of anisotropic characteristic. For example, the ILD cavities 149 may be formed, for example, by depositing a photoresist or other masking layer on a top surface of the semiconductor die 800, i.e., the top surface of the topmost insulating layer 112 of the stack 108 and a top surface of the ILD 126, and a pattern corresponding to the ILD cavities 149 defined in the ILD 126 (e.g., via photolithography, e-beam lithography, or any other suitable lithographic process) over the ILD 126. In other embodiments, a hard mask may be used.

Subsequently, the ILD 126 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the ILD cavities 149. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. The etch used to form the plurality of ILD cavities 149 has high selectivity for etching the ILD material forming the ILD 126 over the memory material that forms the memory layers 114, such that the memory layers serve as an etch stop for the etching process used to form the ILD cavities 149. In this manner, the memory layers 114 serve as etch stops for the etching process, thereby prevent etching of the gate layers 124 and/or the insulating layers 112 disposed therebeneath.

Next, as shown in FIG. 28C an exposed portion of the memory layers 114 at the base of each ILD cavity 149 is selectively etched, for example, using a plasma etching process (e.g., including radical plasma etching, remote plasma etching, RIE, DRIE, or and other suitable plasma etching processes), or a wet etching process, so as to expose a top surface 125 of each of the plurality of gate layers 124. The etch process used to etch the memory layers 114 may have a high etch electivity for the material of the memory layers 114 over the material of the gate layers 124. Subsequently, as shown in FIG. 28D a conductive material (e.g., tungsten (W), copper (Cu), cobalt (Co), or any other suitable material) is deposited in the ILD cavities 149 to form the gate vias 150 that extend from the top surface of the semiconductor die 800 to the corresponding gate layers 124.

Figure 29:
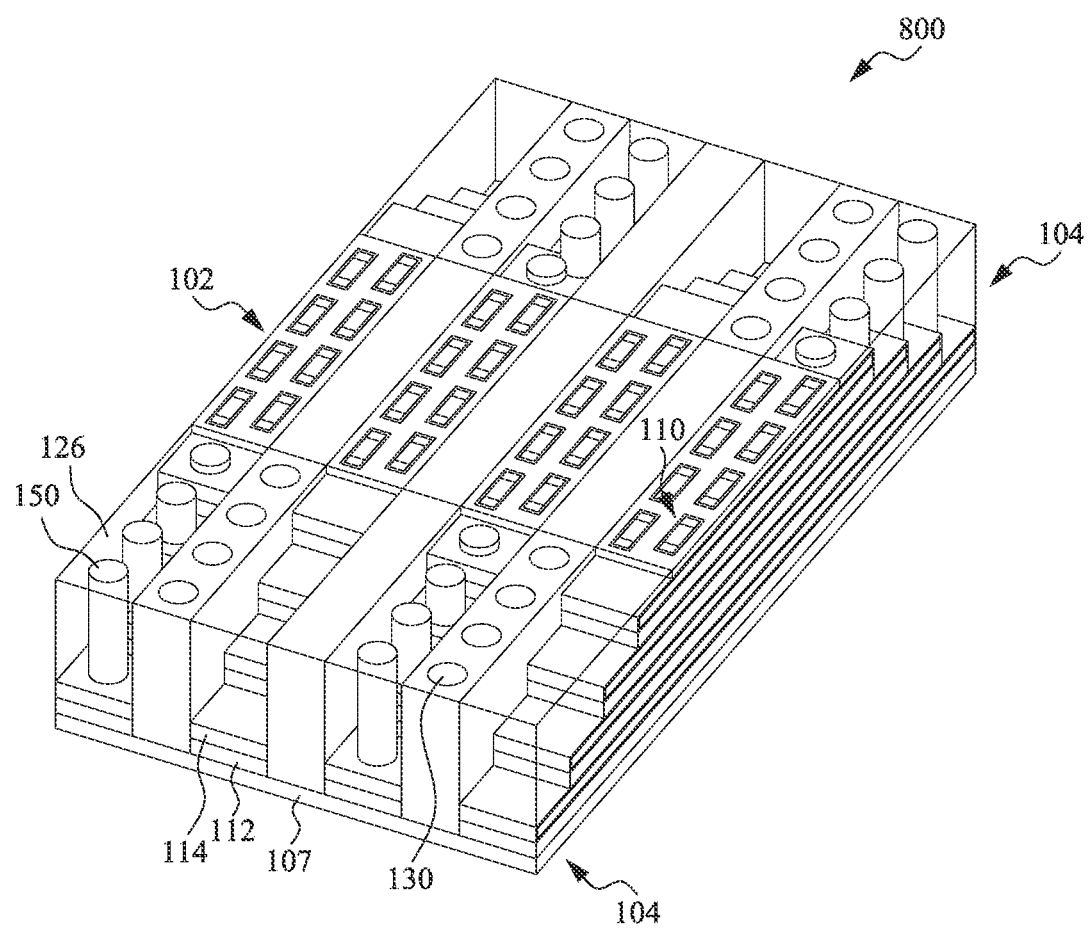

At operation 740, a plurality of interface vias are formed. Corresponding to operation 740, FIG. 29 is a top perspective view of the semiconductor die 800 after the interface vias 130 have been formed. The interface vias 130 may be formed by first etching cavities in the insulation structures 140 using a selective etching process (e.g., a plasma etching process), which can have a certain amount of anisotropic characteristic. For example, the cavities may be formed by depositing a photoresist or other masking layer on a top surface of the semiconductor die 800, and a pattern corresponding to the interface vias 130 defined in the ILD 126 (e.g., via photolithography, e-beam lithography, or any other suitable lithographic process) over the ILD 126. In other embodiments, a hard mask may be used.

Subsequently, the insulation structure 140 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the cavities. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. In some embodiments, the cavities may be etched through the substrate 107 so as to allow interfacing of the interface vias 130 with the external device 10. Next, a conductive material (e.g., tungsten (W), copper (Cu), cobalt (Co), or any other suitable material) is deposited in the cavities to form the interface vias 130 that extend from the top surface of the semiconductor die 800 to the substrate 107 or to a bottom surface of the substrate 107.

Figure 30:
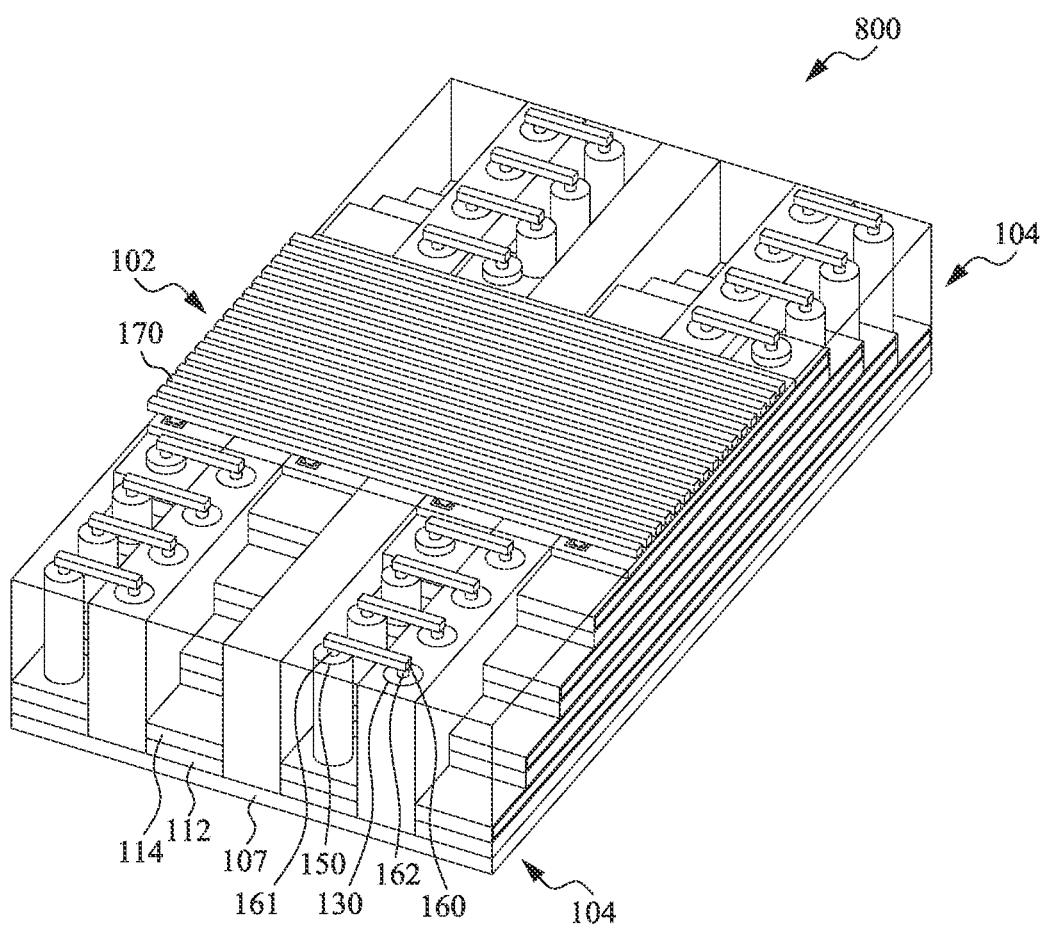

At operation 742, at least one gate through via is formed in the gate vias and at least one interface through via is formed in the interface vias. At operation 744, a plurality of through via caps are formed to couple the gate through via/s of a gate via to interface through vials of an adjacent interface via in the Y-direction so as to electrically coupled the gate via to the corresponding interface via. Moreover, driver lines may also be formed that couple source/drain through vias of source/drains of the semiconductor devices 110 located parallel to each other in the second direction (e.g., the Y-direction), resulting in the final semiconductor die. Corresponding to operation 742-744, FIG. 30 is a top, perspective view of the semiconductor die 800 showing a gate through via 161 formed in the gate via 150, and an interface through via 162 formed in the interface via 130. A source through via and a drain through via may also be formed in the source 120 and drain 122 respectively, of each of the semiconductor devices 110 simultaneously with the gate through vias 161, and the interface through vias 162.

In some embodiments, the gate through via 161 and the interface through via 162 may be disposed at least partially through the gate vias 150, and the interface via 130, respectively. The gate through vias 161 and the interface through vias 162 may be formed from a conducting material, for example, tungsten (W), copper (Cu), cobalt (Co), etc. In some embodiments, the gate through vias 161 and the interface through vias 162 may be formed using a dual damascene process. For example, a cavity may be formed in the gate vias 150 and the interface vias 130. In some embodiments, a spacer layer may be deposited on a top surface of the semiconductor die 800 (e.g., a top surface of the topmost insulating layer 112 and the ILD 126) and throughholes formed in the spacer layer at locations corresponding to the gate vias 150, the interface vias 130, and the source/drain 120, 122. In such embodiments, cavities may not be formed in the gate vias 150 and/or the interface vias 130.

In some embodiments, a diffusion barrier (e.g., a Ta based material) may be deposited in each of the cavities, and a thin metal (e.g., Cu) seed layer is deposited on the diffusion barrier (e.g., using PVD, CVD, MBOE, ALD, etc.). This is followed by electroplating of the metal (e.g., Cu) on the metal seed layer until the metal fills the trenches and projects axially upwards of the ILD 126 and the insulation structures 140. This process can be repeated until gate through vias 161, and interface through vias 162 having a desired height are obtained. The sacrificial layer may be removed before or after forming the various through vias, or after forming the through via caps, or be left disposed on the top surface of the semiconductor die 800.

Each through via cap 160 is coupled to a gate through via 161, and the corresponding interface through via 162 of an interface via 130 located parallel to the gate via 150 in the Y-direction, and each driver line 170 is coupled to source/drain through vias, respectively of each of the semiconductor devices 110 located parallel to each other in the Y-direction.

The through via caps 160 and the driver lines 170 may be formed from a conducting material, for example, tungsten (W), copper (Cu), cobalt (Co), etc. The through via caps 160 and the driver lines 170 may also be formed using a dual damascene process, for example, after formation of the through vias 161 and 162 before removing the spacer layer. While the semiconductor die 800 is shown without the spacer layer, in some embodiments, the spacer layer may remain included in the final semiconductor die 800. As shown in FIG. 5, the through via cap 160 electrically couples the interface via 130 to a gate via 150 located parallel to the interface via 130 in the Y-direction and thereby, to the gate layers 124 that coupled to the respective gate vias 150. In this manner, a gate activation signal may be transmitted from the external device 10 via interface via 130, a through via cap 160, and the gate via 150 to a corresponding gate layer 124. Moreover, the driver lines 170 may be used to communicate an electrical signal (e.g., a current or voltage) to a corresponding source 120 or receive an electrical signal (e.g., a current or voltage) from a corresponding drain 122, when the gate layer 124 is activated.

In some embodiments, a semiconductor die comprises: a device portion comprising an array of semiconductor devices extending in a first direction; and at least one interface portion located adjacent to an axial end of the device portion in the first direction. The interface portion has a staircase profile in a vertical direction. The interface portion comprises: a stack comprising a plurality of gate layers and a plurality of insulating layers alternatively stacked on top of one another, and a memory layer interposed between each of the plurality of gate layers and the plurality of insulating layers.

In some embodiments, a semiconductor die comprises: an array of memory devices extending in a first direction, each of the array of memory devices comprises: a source, a drain spaced apart from the source in the first direction, a channel layer disposed on outer surfaces of the source and the drain, and a plurality of memory layers. A portion of each of the plurality of memory layers is in contact with a portion of outer surfaces of the channel layer.

In some embodiments, a method of making semiconductor die comprising: providing a stack comprising a plurality of insulating layers and a plurality of sacrificial layers alternatively stacked on top of each other. Interface portions are formed at axial ends of the stack in a first direction such that the stack forms a device portion interposed between the interface portions, the interface portions having a staircase profile in the vertical direction. An array of cavities are formed in the device portion. A channel layer is formed on walls of each of the array of cavities, and a source and a drain are formed in each of the array of cavities. The plurality of sacrificial layers as removed, a plurality of memory layers extending from the device portion to the interface portions are formed on walls of the insulating layers that face another insulating layer; and a plurality of gate layers are formed between adjacent insulating layers in the vertical direction such that a memory layer of the plurality of memory layers is interposed between each of the plurality of gate layers and the plurality of insulating layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor die, comprising:
   a device portion comprising an array of semiconductor devices extending in a first direction; and
   at least one interface portion located adjacent to an axial end of the device portion in the first direction, the interface portion having a staircase profile in a vertical direction, the interface portion comprising:
   a stack comprising a plurality of gate layers and a plurality of insulating layers alternatively stacked on top of one another,
   a memory layer interposed between each of the plurality of gate layers and the plurality of insulating layers,
   an array of gate vias, each of the array of gate vias coupled to a corresponding gate layer of the plurality of gate layers through the memory layer, and
   an array of interface vias disposed adjacent to the array of gates gate vias in a second direction perpendicular to the first direction.

2. The semiconductor die of claim 1, wherein the memory layer is disposed on at least a top surface and a bottom surface of each of the plurality of gate layers.

3. The semiconductor die of claim 1, wherein:
   the interface portion further comprises an interlayer dielectric disposed on the stack, and
   the array of gate vias are defined through the interlayer dielectric.

4. The semiconductor die of claim 1, wherein each interface via of the array of interface vias is electrically coupled to a corresponding gate via of the array of gate vias.

5. The semiconductor die of claim 4, wherein:
   the at least one interface portion comprises a plurality of stacks disposed parallel to each other in the second direction, each stack of the plurality of stacks corresponding to a set of semiconductor devices included in the array of semiconductor devices, and
   the semiconductor die further comprises an insulation structure interposed between adjacent stacks of the plurality of stacks in the second direction.

6. The semiconductor die of claim 5, wherein the interface vias are defined through the insulator structure.

7. The semiconductor die of claim 4, wherein each of the array of gate vias and each of the array of interface vias have a polygonal cross-sectional shape.

8. The semiconductor die of claim 4, wherein each of the array of gate vias has a polygonal cross-sectional shape, and each of the array of interface vias has a closed non-polygonal two-dimensional cross-sectional shape.

9. The semiconductor die of claim 4, wherein each of the array of interface vias has a polygonal cross-sectional shape, and each of the array of gate vias has a closed non-polygonal two-dimensional cross-sectional shape.

10. The semiconductor die of claim 4, wherein each interface via of the array of interface vias is axially offset from an adjacent gate via of the array of gate vias in the first direction.

11. A semiconductor die, comprising:
a device portion comprising an array of semiconductor devices extending in a first direction; and
at least one interface portion located adjacent to an axial end of the device portion in the first direction, the interface portion having a staircase profile in a vertical direction, the interface portion comprising:
a stack comprising a plurality of gate layers and a plurality of insulating layers alternatively stacked on top of one another,
a memory layer interposed surrounding each of the plurality of gate layers,
an array of gate vias, each of the array of gate vias coupled to a corresponding gate layer of the plurality of gate layers through the memory layer, and
an array of interface vias disposed adjacent to the array of gates gate vias in a second direction perpendicular to the first direction.

12. The semiconductor die of claim 11, wherein the memory layer includes a ferroelectric material.

13. The semiconductor die of claim 11, wherein:
the interface portion further comprises an interlayer dielectric disposed on the stack, and
the array of gate vias are defined through the interlayer dielectric.

14. The semiconductor die of claim 11, wherein each interface via of the array of interface vias is electrically coupled to a corresponding gate via of the array of gate vias.

15. The semiconductor die of claim 14, further comprising:
a plurality of through via caps electrically couple each of the interface vias to a corresponding one of the gate vias, wherein each of the through via caps extends in the second direction.

16. The semiconductor die of claim 15, wherein the plurality of through via caps are disposed above the array of gate vias and the array of interface vias.

17. The semiconductor die of claim 11, wherein each of the array of gate vias and each of the array of interface vias have a polygonal cross-sectional shape.

18. The semiconductor die of claim 11, wherein each of the array of gate vias has a polygonal cross-sectional shape, and each of the array of interface vias has a closed non-polygonal two-dimensional cross-sectional shape.

19. A semiconductor die, comprising:
a device portion comprising an array of semiconductor devices extending in a first direction; and
at least one interface portion located adjacent to an axial end of the device portion in the first direction, the interface portion having a staircase profile in a vertical direction, the interface portion comprising:
a stack comprising a plurality of gate layers and a plurality of insulating layers alternatively stacked on top of one another,
a memory layer interposed surrounding each of the plurality of gate layers and including a ferroelectric material,
an array of gate vias, each of the array of gate vias coupled to a corresponding gate layer of the plurality of gate layers through the memory layer, and
an array of interface vias disposed adjacent to the array of gates gate vias in a second direction perpendicular to the first direction.

20. The semiconductor die of claim 19, wherein each interface via of the array of interface vias is electrically coupled to a corresponding gate via of the array of gate vias.

* * * * *